(12) United States Patent
Yu et al.

(10) Patent No.: US 12,101,932 B2
(45) Date of Patent: Sep. 24, 2024

(54) MICROELECTRONIC DEVICES, AND RELATED MEMORY DEVICES AND ELECTRONIC SYSTEMS

(71) Applicant: Micron Technology, Inc., Boise, ID (US)

(72) Inventors: Erwin E. Yu, San Jose, CA (US); Surendranath C. Eruvuru, Boise, ID (US); Yoshiaki Fukuzumi, Kanagawa (JP); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 358 days.

(21) Appl. No.: 17/450,729

(22) Filed: Oct. 13, 2021

(65) Prior Publication Data
US 2023/0066649 A1    Mar. 2, 2023

Related U.S. Application Data
(60) Provisional application No. 63/260,804, filed on Sep. 1, 2021.

(51) Int. Cl.
| | |
|---|---|
| *H10B 41/41* | (2023.01) |
| *B81B 7/02* | (2006.01) |
| *G11C 7/10* | (2006.01) |
| *G11C 16/24* | (2006.01) |
| *H10B 41/20* | (2023.01) |

(Continued)

(52) U.S. Cl.
CPC ............. *H10B 41/41* (2023.02); *B81B 7/02* (2013.01); *G11C 7/1012* (2013.01); *G11C 16/24* (2013.01); *H10B 41/20* (2023.02); *H10B 43/20* (2023.02); *H10B 43/40* (2023.02); *B81B 2201/07* (2013.01)

(58) Field of Classification Search
CPC ........ H10B 41/41; H10B 41/20; H10B 43/20; H10B 43/40; H10B 41/27; H10B 43/27; B81B 7/02; B81B 2201/07; G11C 7/1012; G11C 16/24; G11C 16/0483
See application file for complete search history.

(56) References Cited

U.S. PATENT DOCUMENTS
| | | |
|---|---|---|
| 6,400,604 B2 | 6/2002 | Noda |
| 8,456,920 B2 | 6/2013 | Arizono |

(Continued)

*Primary Examiner* — Allison Bernstein
(74) *Attorney, Agent, or Firm* — TraskBritt

(57) ABSTRACT

A microelectronic device comprises a stack structure, first digit lines, second digit lines, and multiplexer devices. The stack structure comprises an access line region comprising a lower group of conductive structures, and a select gate region overlying the access line region and comprising an upper group of conductive structures. The first digit lines are coupled to strings of memory cells, and the second digit lines are coupled to additional strings of memory cells. The second digit lines are horizontally offset from the first digit lines in a first direction and are substantially horizontally aligned with the first digit lines in a second direction. The multiplexer devices are coupled to page buffer devices, the first digit lines, and the second digit lines. The multiplexer devices comprise transistors in electrical communication with the upper group of conductive structures. Additional microelectronic devices, memory devices, and electronic systems are also described.

25 Claims, 8 Drawing Sheets

(51) Int. Cl.
*H10B 43/20* (2023.01)
*H10B 43/40* (2023.01)

(56) References Cited

U.S. PATENT DOCUMENTS

| | | |
|---|---|---|
| 8,611,153 B2 | 12/2013 | Tanzawa |
| 8,656,092 B2 | 2/2014 | Ha |
| 8,958,228 B2 | 2/2015 | Samachisa et al. |
| 8,971,112 B2 | 3/2015 | Crippa et al. |
| 9,299,442 B2 | 3/2016 | Ha |
| 9,305,660 B2 | 4/2016 | Moschiano et al. |
| 9,343,169 B2 | 5/2016 | Vali et al. |
| 9,672,156 B2 | 6/2017 | Ha |
| 10,468,116 B2 | 11/2019 | Ha |
| 10,510,397 B2 | 12/2019 | Yamada |
| 11,393,845 B2 * | 7/2022 | Kawai ................ G11C 7/18 |
| 2009/0268537 A1 | 10/2009 | Kajigaya |
| 2018/0364908 A1 | 12/2018 | Lea et al. |
| 2018/0365293 A1 | 12/2018 | De Santis et al. |
| 2020/0118615 A1 | 4/2020 | Yamada |
| 2023/0024655 A1 * | 1/2023 | Lee ................ H10B 43/10 |
| 2024/0074142 A1 * | 2/2024 | Simsek-Ege ......... H10B 12/482 |

\* cited by examiner

MICROELECTRONIC DEVICES, AND RELATED MEMORY DEVICES AND ELECTRONIC SYSTEMS

CROSS-REFERENCE TO RELATED APPLICATION

This application claims the benefit under 35 U.S.C. § 119(e) of U.S. Provisional Patent Application Ser. No. 63/260,804, filed Sep. 1, 2021, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through a stack structure including tiers of conductive structures and insulative materials. Each string of memory cells may include at least one select device coupled in series to a serial combination of vertically stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional (2D)) arrangements of transistors.

In a conventional non-volatile memory device (e.g., a conventional 3D NAND Flash memory device) including a vertical memory array, digit lines (e.g., bit lines, data lines) are coupled to the strings of memory cells of the vertical memory array, and openings are provided next to edges of the vertical memory array to accommodate digit line contacts for each of the digit lines. The digit line contacts electrically connect the digit lines to logic circuitry to facilitate operations (e.g., read operations, program operations, erase operations) on the strings of memory cells of the vertical memory array. However, conventional configurations of digit lines and logic circuitry can hamper improvements in the performance (e.g., data transfer rates, power consumption) of the non-volatile memory device, and/or can impede reductions to the sizes (e.g., horizontal footprints) of features of the non-volatile memory device.

DETAILED DESCRIPTION

Figure 1:
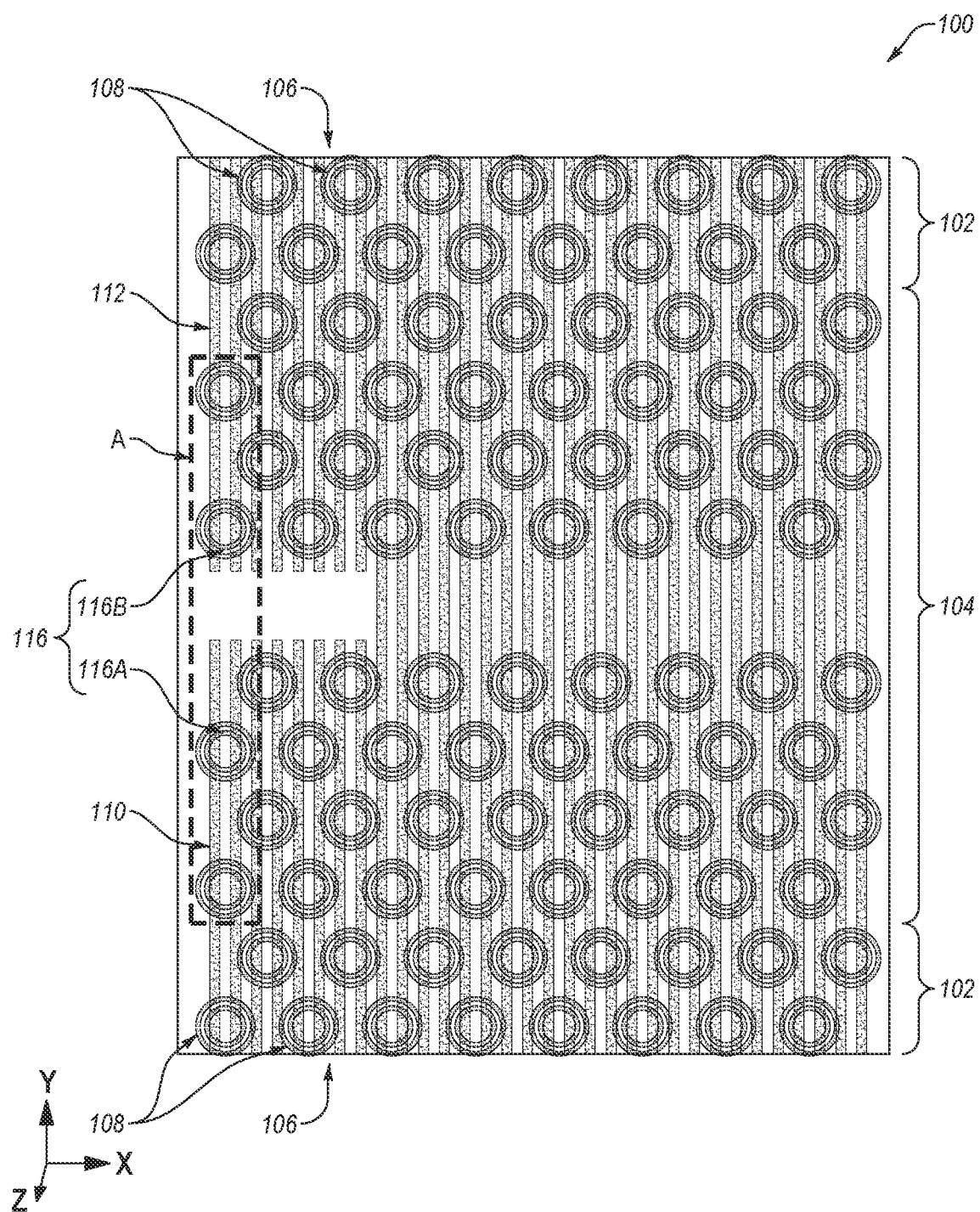
FIG. 1 is simplified, partial plan view of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, trenches, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 2:
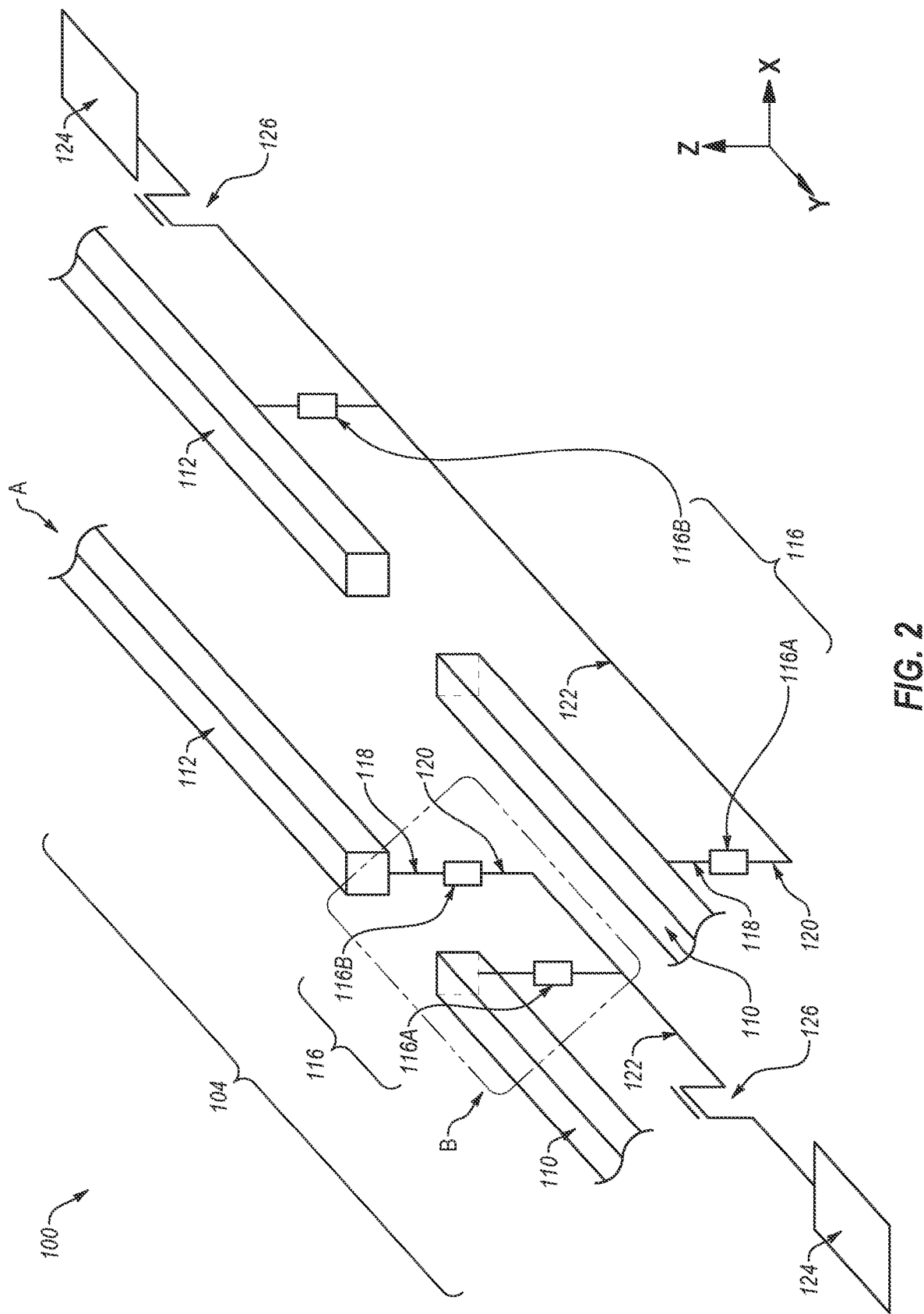
FIG. 2 is simplified, partial perspective view of a section of the microelectronic device structure shown in FIG. 1.
Figure 3:
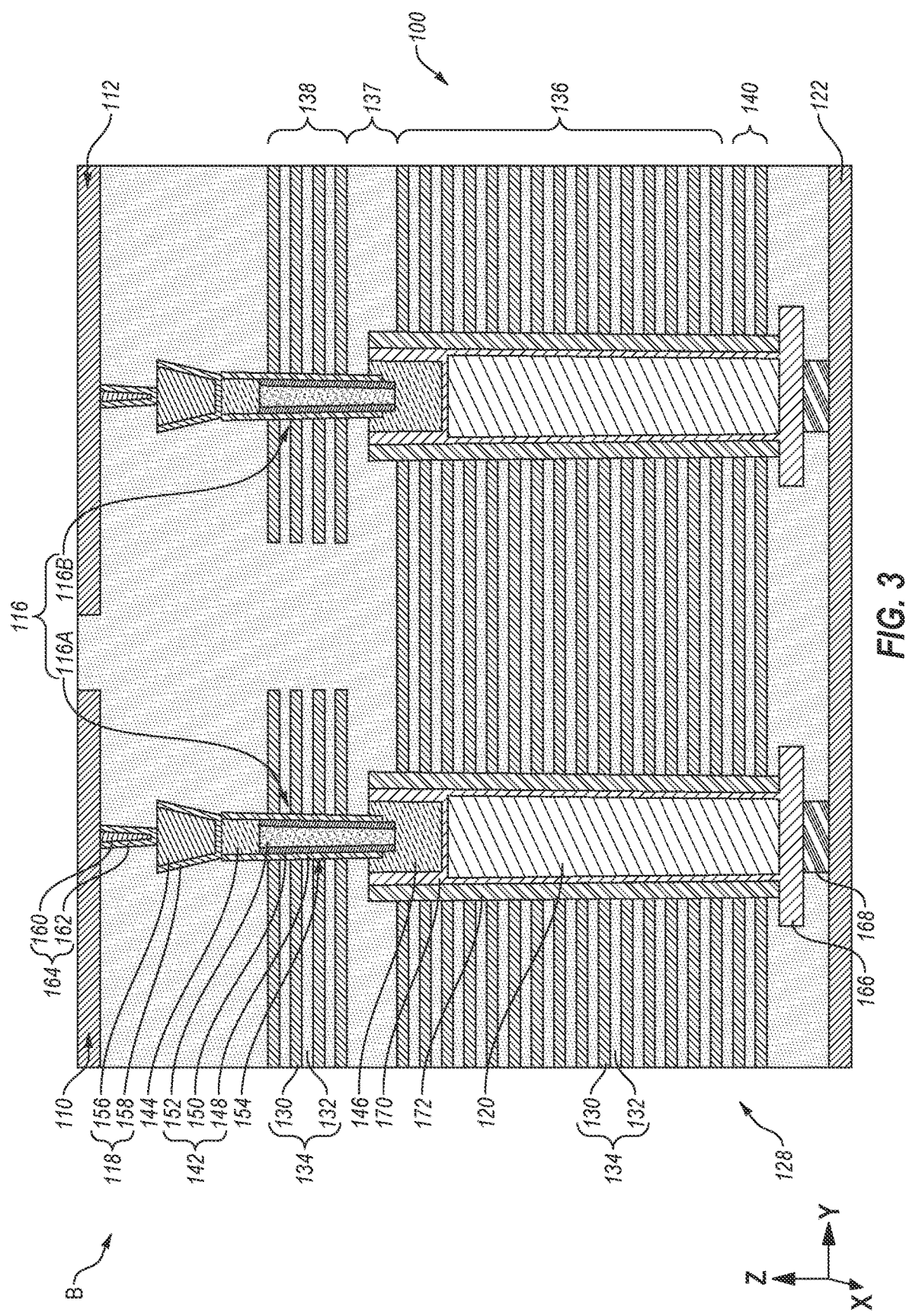
FIG. 3 is simplified, partial cross-sectional view of a sub-section of the section of the microelectronic device structure shown in FIG. 2.

FIG. 1 is a simplified, partial plan view of a microelectronic device structure 100 (e.g., a memory device structure, such as a 3D NAND Flash memory device structure) for a microelectronic device (e.g., a memory device, such as a 3D NAND Flash memory device), in accordance with embodiments of the disclosure. FIG. 2 is simplified, partial perspective view of a section A (depicted by way of dashed lines in FIG. 1) of the microelectronic device structure 100 shown in FIG. 1. FIG. 3 is simplified, partial cross-sectional view of a sub-section B (depicted by way of dashed lines in FIG. 2) of the section A of the microelectronic device structure 100 shown in FIG. 2. For clarity and ease of understanding of the drawings and related description, not all components (e.g., features, structures, devices) of the microelectronic device structure 100 depicted in one or more of FIGS. 1 through 3 are depicted in one of more other of FIGS. 1 through 3. With the description provided below, it will be readily apparent to one of ordinary skill in the art that the structures and devices described herein may be included in relatively larger structures, devices, and systems.

Referring to FIG. 1, the microelectronic device structure 100 may include memory array regions 102, and an additional region 104 horizontally interposed, in a Y-direction (e.g., a first horizontal direction), between the memory array regions 102. The memory array regions 102 may each include memory arrays 106 including strings of memory cells 108 extending in a Z-direction (e.g., a vertical direction). In addition, the microelectronic device structure 100 includes digit lines (e.g., data lines, bit lines) coupled to the strings of memory cells 108 of the memory arrays 106, including first digit lines 110 and second digit lines 112. The first digit lines 110 may be substantially horizontally aligned with the second digit lines 112 in an X-direction (e.g., a second horizontal direction) orthogonal to the Y-direction, and may be horizontally offset (e.g., horizontally separated) from the second digit lines 112 in the Y-direction. The first digit lines 110 and the second digit lines 112 may horizontally terminate within the additional region 104 of the microelectronic device structure 100. In addition, within a horizontal area of the additional region 104, microelectronic device structure 100 includes multiplexer (MUX) devices 116 coupled to the first digit lines 110 and the second digit lines 112, and also coupled to logic circuitry (e.g., page buffer circuitry) vertically underlying the memory array regions 102. The MUX devices 116 may be at least partially (e.g., substantially) confined within a horizontal area of the additional region 104. The microelectronic device structure 100 also includes additional features (e.g., additional structures, additional devices), as described in further detail below.

With continued reference to FIG. 1, the memory arrays 106 within the memory array regions 102 of the microelectronic device structure 100 may include rows of the strings of memory cells 108 extending in the X-direction and columns of the strings of memory cells 108 extending in the Y-direction. The memory arrays 106 within the memory array regions 102 may individually include a desirable quantity of the strings of memory cells 108.

The strings of memory cells 108 may be located within a stack structure (described in further detail below with reference to FIG. 3) including a vertically alternating sequence of conductive structures and insulative structures arranged in tiers. Intersections between the conductive structures of the stack structure and cell pillar structures vertically extending through the stack structure may form memory cells of the strings of memory cells 108. The cell pillar structures may each individually be formed of and include a stack of materials. By way of non-limiting example, each of the cell pillar structures may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductor material (e.g., silicon, such as polycrystalline Si); and a dielectric fill material (e.g., a dielectric oxide, a dielectric nitride, air). The charge-blocking material may be formed on or over surfaces of the conductive structures and the insulative structures of the tiers of stack structure at least partially defining horizontal boundaries of the cell pillar structures; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material. In some embodiments, the memory cells 108 comprise so-called "MONOS" (metal-oxide-nitride-oxide-semiconductor) memory cells. In additional embodiments, the memory cells 108 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 108 comprise so-called "floating gate" memory cells including floating gates (e.g., metallic floating gates) as charge storage structures.

Still referring to FIG. 1, the microelectronic device structure 100 may exhibit a desirable pattern of the first digit lines 110 and the second digit lines 112 thereof. A pattern of the first digit lines 110 and the second digit lines 112 may be formed by selectively cutting relatively larger preliminary digit lines at desirable horizontal positions (e.g., in the Y-direction) to form the first digit lines 110 and the second digit lines 112 therefrom. In some embodiments, one or more group(s) of the preliminary digit lines are cut at different horizontal positions (e.g., in the Y-direction) within the microelectronic device structure 100 than one or more other group(s) of the preliminary digit lines, such that group(s) of the first digit lines 110 and group(s) the second digit lines 112 formed from the group(s) of the preliminary digit lines horizontally terminate (e.g., in the Y-direction) at different locations within the microelectronic device structure 100 than other group(s) of the first digit lines 110 and other group(s) the second digit lines 112 formed from the other group(s) of the preliminary digit lines. By way of non-limiting example, as depicted in FIG. 1, eight (8) out of thirty-two (32) preliminary digit lines may be cut at a first horizontal position (e.g., in the Y-direction) within the additional region 104 of the microelectronic device structure 100 while a remaining twenty-four (24) out of the thirty-two (32) preliminary digit lines are not cut at the first horizontal position, such that eight (8) first digit lines 110 and eight (8) second digit lines 112 formed from the eight (8) preliminary digit lines horizontally terminate at the first horizontal position but additional digit lines (e.g., additional first digit lines 110 and additional second digit lines 112) formed from the other twenty-four (24) preliminary digit lines do not horizontally terminate at the first horizontal position. In additional embodiments, the microelectronic device structure 100 is formed to exhibit a different pattern of the first digit lines 110 and the second digit lines 112. For example, at least one group of the first digit lines 110 may include a different quantity (e.g., less than eight (8), greater than eight (8)) of first digit lines 110 horizontally terminating at substantially the same horizontal position (e.g., in the Y-direction) within the additional region 104 of the microelectronic device structure 100; and at least one group of the second digit lines 112 horizontally aligned (e.g., in the X-direction) with the at least one group of the first digit lines 110 may include a different quantity (e.g., less than eight (8), greater than eight (8)) of the second digit lines 112 horizontally terminating at substantially the same horizontal position (e.g., in the Y-direction) within the additional region 104 of the microelectronic device structure 100.

The first digit lines 110 may exhibit horizontally elongate shapes extending in parallel in the Y-direction and separated from one another in the X-direction. As used herein, the term "parallel" means substantially parallel. In addition, the second digit lines 112 may also exhibit horizontally elongate shapes extending in parallel in the Y-direction and separated from one another in the X-direction. The first digit lines 110 and the second digit lines 112 may be located at substantially the same vertical position in the Z-direction within the microelectronic device structure 100 as one another. The first digit lines 110 may be discontinuous with the second digit lines 112, and may be coupled to different strings of memory cells 108 than the second digit lines 112. As shown in FIG. 1, at least some of the first digit lines 110 may be positioned within different memory array regions 102 of the microelectronic device structure 100 (and, hence, may horizontally extend over different memory arrays 106) than at least some of the second digit lines 112.

The first digit lines 110 may have substantially the same dimensions (e.g., length in the Y-direction, width in the X-direction, height in the Z-direction), shape, and spacing as the second digit lines 112; or the first digit lines 110 may have one or more of different dimension(s) (e.g., different length in a Y-direction, different width in the X-direction, different height in the Z-direction), different shape, and different spacing than the second digit lines 112. In some embodiments, lengths of at least some the first digit lines 110 in the Y-direction are substantially equal to (e.g., substantially the same as) lengths of at least some of the second digit lines 112 in the Y-direction. In additional embodiments, the lengths of at least some of the first digit lines 110 in the Y-direction are different than (e.g., less than, greater than) the lengths of at least some of the second digit lines 112 in the Y-direction.

Referring next to FIG. 2, the MUX devices 116 of the microelectronic device structure 100 may be coupled to the first digit lines 110 and the second digit lines 112 at least by way of first contact structures 118 (e.g., digit line contact structures). In addition, the MUX devices 116 may be coupled to page buffer devices 124 of the microelectronic device structure 100 at least by way of second contact structures 120 and conductive routing structures 122. Optionally, one or more isolation devices 126 may be coupled to the conductive routing structures 122 and may electrically intervene between the page buffer devices 124 and the MUX devices 116. The MUX devices 116 may be arranged in pairs, each of the pairs including a first MUX device 116A and a second MUX device 116B. For each pair of the MUX devices 116, the first MUX device 116A thereof may be coupled to one of the first digit lines 110, and may also be coupled to at least one of the conductive routing structures 122; and the second MUX device 116B thereof may be coupled to one of the second digit lines 112 horizontally aligned with the one of the first digit lines 110, and may also be coupled to the at least one of the conductive routing structures 122.

The MUX devices 116 may be configured and operated to selectively forward signals received from the first digit lines 110 and the second digit lines 112 to the page buffer devices 124, and vice versa. The MUX devices 116 are described in further detail below with reference to FIG. 3. For an individual pair of MUX devices 116, an active state (e.g., an ON state, a selected state) of the first MUX device 116A thereof concurrent with an inactive state (e.g., on OFF state, a deselected state) of the second MUX device 116B thereof may facilitate signal transmission between a page buffer device 124 and a first digit line 110 coupled to the first MUX device 116A, while precluding signal transmission between the page buffer device 124 and a second digit line 112 coupled to the second MUX device 116B. Conversely, for an individual pair of MUX devices 116, an active state (e.g., an ON state, a selected state) of the second MUX device 116B thereof concurrent with an inactive state (e.g., on OFF state, a deselected state) of the first MUX device 116A thereof may facilitate signal transmission between a page buffer device 124 and a second digit line 112 coupled to the second MUX device 116B, while precluding signal transmission between the page buffer device 124 and a first digit line 110 coupled to the first MUX device 116A.

Still referring to FIG. 2, the page buffer devices 124 individually may be configured to sense data (e.g., in the form of a signal) on a conductive routing structure 122 (as received from a first MUX device 116A coupled a first digit line 110, or from a second MUX device 116B coupled a second digit line 112) coupled thereto, and to store (e.g., temporarily store) one or more bit(s) of information carried by the conductive routing structure 122. Each page buffer device 124 may individually be in electrical communication an individual first digit line 110 and an individual second digit line 112 by way of an individual pair of MUX devices 116 coupled thereto. The page buffer devices 124 may also be coupled to input/output (I/O) devices and additional data paths, and may facilitate or promote desirable transfer of data (e.g., in the form of a signal) between the I/O devices and the strings of memory cells 108 (FIG. 1) of the memory arrays 106 (FIG. 1). Each page buffer device 124 may, for example, include page buffer circuitry comprising an arrangement of data cache circuitry (e.g., dynamic data cache (DDC) circuitry, primary data cache (PDC) circuitry, secondary data cache (SDC) circuitry, temporary data cache (TDC) circuitry), sense amplifier (SA) circuitry, and digit line pre-charge circuitry.

The isolation devices 126 (e.g., isolation transistors), if included, may be configured and operated to isolate voltages employed in the memory array regions 102 (FIG. 1) and/or the additional region 104 from other features (e.g., structures, devices) of the microelectronic device structure 100. The isolation devices 126 may be interposed between the MUX devices 116 and the page buffer devices 124 at desirable locations along the paths of the conductive routing structures 122. In some embodiments, the isolation devices 126 comprise high-voltage-isolation (HVISO) transistors configured and operated to pass voltages greater than or equal to about 18V, such as within a range of from about 18V to about 25V. In additional embodiments, the isolation devices 126 comprise low-voltage-isolation (LVISO) transistors configured and operated to substantially block applied voltages on digit lines 110 and 112 to protect the page buffer devices 124 while in an inactive state (e.g., an OFF state, a deselected state).

Referring collectively to FIGS. 1 and 2, the configuration of the microelectronic device structure 100 facilitates enhanced microelectronic device (e.g., memory device) performance relative to conventional configurations. For example, the relatively shorter lengths in the Y-direction of the first digit lines 110 and the second digit lines 112 as compared to conventional digit line lengths (e.g., individual digit line lengths greater than or equal to combined lengths of an individual first digit line 110 and an individual second digit line 112) may facilitate relatively faster data transfer rates. Data may be received from the first digit lines 110 and the second digit line 112 relatively faster during read operations, and data may be programmed to predetermined memory cells through the first digit lines 110 and the second digit lines 112 relatively faster during program operations. The configuration of the microelectronic device structure 100 may also facilitate reduced power consumption as compared to conventional configurations.

Referring next to FIG. 3, the MUX devices 116 and the second contact structures 120 of the microelectronic device structure 100 may be formed to vertically extend (e.g., in the Z-direction) through a stack structure 128 of the microelectronic device structure 100 including a vertically alternating (e.g., in the Z-direction) sequence of conductive structures 130 and insulative structures 132 and arranged in tiers 134. The stack structure 128 may be vertically interposed between the conductive routing structures 122 and each of the first digit lines 110 and the second digit lines 112. Each of the tiers 134 of the stack structure 128 may include at least one of the conductive structures 130 vertically neighboring at least one of the insulative structures 132. As described in further detail below, the MUX devices 116 and the second contact structures 120 may vertically extend through different regions of the stack structure 128 than one another, wherein at least some of the conductive structures 130 within one or more of the different regions have different configurations and/or operational functions within the microelectronic device structure 100 than at least some other of the conductive structures 130 within one or more other of the different regions.

In some embodiments, the conductive structures 130 of the stack structure 128 are formed of and include tungsten (W), and the insulative structures 132 are formed of and include silicon dioxide ($SiO_2$). In additional embodiments, the conductive structures 130 are formed of and include at least one different conductive material (e.g., semiconductor material doped with at least one conductivity-enhancing dopant; a different metal; an alloy; a conductive metal-containing material), and/or the insulative structures 132 are formed of and include at least one different insulative material (e.g., a different dielectric oxide material, a dielectric nitride material, a dielectric oxynitride material, a dielectric oxycarbide material, a hydrogenated dielectric oxycarbide material, a dielectric carboxynitride material). The conductive structures 130 and insulative structures 132 of the tiers 134 of the stack structure 128 may each individually be substantially planar, and may each individually exhibit a desired thickness (e.g., vertical dimension in the Z-direction).

Optionally, one or more liner materials (e.g., insulative liner material(s), conductive liner material(s)) may be formed around the conductive structures 130 of the stack structure 128. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 130. In some embodiments, the liner material(s) comprise titanium nitride. In further embodiments, the liner material(s) further include aluminum oxide. As a non-limiting example, aluminum oxide may be formed directly adjacent the insulative structures 132, titanium nitride may be formed directly adjacent the aluminum oxide, and tungsten may be formed directly adjacent the titanium nitride. For clarity and ease of understanding the description, the liner material(s)

are not illustrated in FIG. 3, but it will be understood that the liner material(s) may be disposed around the conductive structures 130.

The stack structure 128 may be divided into multiple regions located at different vertical positions (e.g., vertical elevations) than one another. For example, as shown in FIG. 3, the stack structure 128 may include an access line region 136 (e.g., a word line region), a first select gate region 138 (e.g., an upper select gate region, a drain side select gate (SGD) region) vertically overlying the access line region 136, and a second select gate region 140 (e.g., a lower select gate region, a source side select gate (SGS) region) vertically underlying the access line region 136. Within boundaries of the access line region 136, at least some of the conductive structures 130 may be employed as local access lines (e.g., local word lines) for memory cells of the strings of memory cells 108 (FIG. 1) of the memory arrays 106 (FIG. 1) of the microelectronic device structure 100. Within boundaries of the first select gate region 138, at least some of the conductive structures may be employed as first select gates (e.g., SGDs, upper select gates) for the strings of memory cells 108 (FIG. 1) of the memory arrays 106 (FIG. 1). Within boundaries of the second select gate region 140, at least some of the conductive structures 130 may be employed as second select gates (e.g., SGSs, lower select gates) for the strings of memory cells 108 (FIG. 1) of the memory arrays 106 (FIG. 1).

As shown in FIG. 3, in some embodiments, an isolation region 137 is vertically interposed (e.g., in the Z-direction) between the access line region 136 and the first select gate region 138 of the stack structure 128. The isolation region 137 may include at least one insulative material (e.g., at least one dielectric material, such as at least one dielectric oxide material). A vertical thickness of the insulative material may be greater than a vertical thickness of an individual insulative structure 132 of an individual tier 134 of the stack structure 128. In addition, within boundaries of the first select gate region 138, the stack structure 128 may further include one or more filled slots vertically extending therethrough. The filled slots may comprise slots (e.g., slits, trenches, openings) at least partially (e.g., substantially) filled with at least one insulative material (e.g., at least one dielectric material, such as at least one dielectric oxide material). The filled slots may, for example, be employed to horizontally separate and electrically isolate conductive structures 130 employed as the first select gates (e.g., SGDs, upper select gates) within first select gate region 138 of the stack structure 128. In addition, one or more additional filled slots may vertically extend completely through the stack structure 128. The one or more additional filled slots may, for example, be employed to partition (e.g., divide) the stack structure 128 into multiple (e.g., more than one) blocks.

With continued reference to FIG. 3, each of the MUX devices 116 (including the first MUX device 116A and the second MUX device 116B of each pair of the MUX devices 116 coupled to the same conductive routing structure(s) 122 as one another) may individually include a pillar structure 142, a first pillar contact structure 144 vertically overlying the pillar structure 142, and a second pillar contact structure 146 vertically underlying the pillar structure 142. The pillar structure 142 may vertically extend from and between the first pillar contact structure 144 and the second pillar contact structure 146. For each of the MUX devices 116, conductive structures 130 of the tiers 134 of the stack structure 128 within the first select gate region 138 of the stack structure 128 may contact (e.g., physically contact, electrically contact) the pillar structure 142 of the MUX device 116 to form transistors of the MUX device 116, as described in further detail below. As shown in FIG. 3, for each of the MUX devices 116, the first pillar contact structure 144 thereof may be interposed between the pillar structure 142 thereof and one of the first contact structures 118; and the second pillar contact structure 146 thereof may be interposed between the pillar structure 142 thereof and one of the second contact structures 120.

For each of the MUX devices 116 (e.g., each of the first MUX devices 116A and each of the second MUX devices 116B), the pillar structure 142 thereof may be formed of and include a stack of materials. For example, each pillar structure 142 may include a gate dielectric material 148, a channel material 150, and a dielectric fill material 152. The gate dielectric material 148 may be horizontally interposed between the channel material 150 and the conductive structures 130 of the tiers 134 of the stack structure 128 within the first select gate region 138 of the stack structure 128. The channel material 150 may be horizontally interposed between the gate dielectric material 148 and the dielectric fill material 152. For each pillar structure 142, the dielectric fill material 152 thereof may be outwardly horizontally surrounded by the channel material 150 thereof; and the channel material 150 thereof may be outwardly horizontally surrounded by the gate dielectric material 148 thereof.

In some embodiments, the gate dielectric material 148 of each of the pillar structures 142 may be formed of and include at least one dielectric material, such as one or more of at least one oxide dielectric material (e.g., one or more of $SiO_x$, $AlO_x$, phosphosilicate glass, borosilicate glass, borophosphosilicate glass, fluorosilicate glass), at least one nitride dielectric material (e.g., $SiN_y$), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). In some embodiments, the gate dielectric material 148 is formed of and includes $SiO_x$ (e.g., $SiO_2$). In additional embodiments, the gate dielectric material 148 is formed of and includes $AlO_x$ (e.g., $Al_2O_3$). The gate dielectric material 148 may be substantially homogeneous, or the gate dielectric material 148 may be heterogeneous.

As shown in FIG. 3, the gate dielectric material 148 may at least partially cover outer side surfaces (e.g., outer sidewalls) of the channel material 150. The gate dielectric material 148 may, for example, substantially cover portions of the outer side surfaces of the channel material 150 within vertical boundaries of the first select gate region 138 of the stack structure 128. For each pillar structure 142, the gate dielectric material 148 thereof may horizontally extend from and between the channel material 150 thereof and the conductive structures 130 of the tiers 134 of the stack structure 128 within the first select gate region 138. In addition, the gate dielectric material 148 may also at least partially cover additional portions of the outer side surfaces of the channel material 150 outside of the vertical boundaries of the first select gate region 138 of the stack structure 128. For example, the gate dielectric material 148 may cover portions of the channel material 150 within vertical boundaries of the isolation region 137 is vertically interposed between the access line region 136 and the first select gate region 138 of the stack structure 128. In some embodiments, for an individual MUX device 116, the gate dielectric material 148 of the pillar structure 142 thereof vertically extends into the second pillar contact structure 146 thereof to at least partially cover portions of outer side surfaces of the channel material 150 of the pillar structure 142 within vertical boundaries of the second pillar contact structure 146. Furthermore, for an individual MUX device 116, the gate dielectric material 148 thereof may also be formed to at least partially cover additional portions of the MUX device 116. For example, as depicted in FIG. 3, for an individual MUX device 116, gate dielectric material 148 thereof may also at least partially (e.g., substantially) cover outer side surfaces of the first pillar contact structure 144 of the MUX device 116.

The channel material 150 of each of the pillar structures 142 may be formed of and include at least one semiconductor material, such as one or more of silicon, (e.g., polycrystalline silicon), germanium, silicon-germanium, and oxide semiconductor material. In some embodiments, the channel material 150 comprises polycrystalline silicon. The polycrystalline silicon may be doped with one or more conductivity-enhancing dopant (e.g., at least one P-type dopant, such as one or more of boron, aluminum, and gallium; or at least one N-type dopant, such as one or more of phosphorus, arsenic, antimony, and bismuth), or may be substantially undoped. In additional embodiments, the channel material 150 comprises at least one oxide semiconductor material having a band gap larger than that polycrystalline silicon, such as a band gap larger than 1.65 electronvolts (eV). By way of non-limiting example, the channel material 150 may be formed of and include one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_zO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. The channel material 150 may be substantially homogeneous, or the channel material 150 may be heterogeneous.

The channel material 150 of each pillar structure 142 may be formed to have a desired shape. In some embodiments, for an individual pillar structure 142, the channel material 150 thereof at least partially (e.g., substantially) covers outer side surfaces (e.g., outer sidewalls) and a lower surface (e.g., a bottom surface) of the dielectric fill material 152 of the pillar structure 142. For example, the dielectric fill material 152 may be horizontally interposed between different portions of the channel material 150, and may vertically terminate on the channel material 150. Lower surfaces of the channel material 150 may physically contact surfaces of the second pillar contact structure 146 of the MUX device 116 including the pillar structure 142, and lower surfaces the dielectric fill material 152 may physically contact horizontally extending surfaces of the channel material 150. In some embodiments, for an individual MUX device 116, the channel material 150 of the pillar structure 142 thereof vertically extends into the second pillar contact structure 146 thereof and substantially covers portions of the dielectric fill material 152 of the pillar structure 142 within vertical boundaries of the second pillar contact structure 146. In additional embodiments, the channel material 150 of each pillar structure 142 is configured such that the dielectric fill material 152 vertically extends (i.e., in the Z-direction) therethrough and to the second pillar contact structure 146 of the MUX device 116 including the pillar structure 142. Lower surfaces of the channel material 150 may physically contact an upper surfaces of the second pillar contact structure 146, and lower surfaces of the dielectric fill material 152 may also physically contact the upper surface of the second pillar contact structure 146. Furthermore, for an individual MUX device 116, an upper surface of the channel material 150 of the pillar structure 142 thereof may physically contact lower surfaces of the first pillar contact structure 144 of the MUX device 116. In some embodiments, for an individual MUX device 116, the upper surface of the channel material 150 thereof is substantially coplanar with an upper surface of the dielectric fill material 152 thereof, and is vertically offset from (e.g., vertically recessed relative to) an upper surface of the gate dielectric material 148 thereof.

The dielectric fill material 152 of each of the pillar structures 142 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and air. In some embodiments, the dielectric fill material 152 is formed of and includes at least one dielectric oxide material (e.g., $SiO_x$, such as $SiO_2$). In additional embodiments, the dielectric fill material 152 is formed of and includes at least one dielectric nitride material (e.g., $SiN_y$, such as $Si_3N_4$). In further embodiments, the dielectric fill material 152 is formed of and includes $YO_x$ (e.g., yttrium (III) oxide ($Y_2O_3$)). The dielectric fill material 152 may be substantially homogeneous, or the dielectric fill material 152 may be heterogeneous.

The dielectric fill material 152 of each pillar structure 142 may substantially cover inner side surfaces (e.g., inner sidewalls) of the channel material 150 of the pillar structure 142. The dielectric fill material 152 may be directly horizontally adjacent the inner side surfaces (e.g., inner sidewalls) of the channel material 150. As shown in FIG. 3, for an individual MUX device 116, the dielectric fill material 152 may be formed to vertically extend (i.e., in the Z-direction) from the first pillar contact structure 144 of the MUX device 116 toward the second pillar contact structure 146 of the MUX device 116. A lower boundary (e.g., a lower surface) of the dielectric fill material 152 may be located vertically below, vertically above, or vertically at an upper vertical boundary (e.g., an upper surface) of the second pillar contact structure 146. In some embodiments, for an individual MUX device 116, the dielectric fill material 152 of the pillar structure 142 thereof vertically extends into the second pillar contact structure 146 thereof.

For each MUX device 116 (e.g., each first MUX device 116A, each second MUX device 116B) of the microelectronic device structure 100, intersections of the pillar structure 142 thereof and the conductive structures 130 of at least some of the tiers 134 of the stack structure 128 within the first select gate region 138 may define transistors 154 of the MUX device 116. In some embodiments, the transistors 154 of an individual MUX device 116 comprise metal-oxide-semiconductor (MOS) transistors. If the conductive structures 130 of the tiers 134 of the stack structure 128 within the first select gate region 138 are employed as SGDs for the microelectronic device structure 100, the transistors 154 of an individual MUX device 116 may comprise MOS-SGD transistors, and the MUX device 116 may comprise a MOS-SGD MUX device.

Still referring to FIG. 3, for each MUX device 116, the first pillar contact structure 144 thereof may contact (e.g., physically contact, electrically contact) the channel material 150 of the pillar structure 142 thereof. In some embodiments, for each MUX device 116, a lower boundary (e.g., a lower surface) of the first pillar contact structure 144 thereof is substantially coplanar with an upper boundary (e.g., an upper surface) of the channel material 150 of the pillar structure 142 thereof. The lower boundary of the first pillar contact structure 144 may vertically underlie an upper boundary (e.g., an upper surface) of the gate dielectric material 148 of the MUX device 116, such that the gate dielectric material 148 at least partially (e.g., substantially) covers side surfaces (e.g., sidewalls) of the first pillar contact structure 144. In additional embodiments, the lower boundary of the first pillar contact structure 144 vertically underlies the upper boundary of the channel material 150 of the MUX device 116, such that the channel material 150 at least partially (e.g., substantially) covers the side surfaces of the first pillar contact structure 144. In some embodiments, for each MUX device 116, the lower boundary of the first pillar contact structure 144 thereof vertically overlies (e.g., in the Z-direction) an upper boundary (e.g., an upper surface) of an uppermost conductive structure 130 within vertical boundaries of the first select gate region 138 of the stack structure 128.

The first pillar contact structure 144 of each of the MUX devices 116 may be formed of and include conductive material. As a non-limiting example, the first pillar contact structures 144 may each individually be formed of and include one or more of at least one conductively doped semiconductor material, at least one metal, at least one alloy, and at least one conductive metal-containing material (e.g., a conductive metal nitride, a conductive metal silicide, a conductive metal carbide, a conductive metal oxide). In some embodiments, each first pillar contact structure 144 is formed of and includes polycrystalline silicon doped with one or more conductivity-enhancing dopants (e.g., one or more N-type dopants, one or more P-type dopants). Each of the first pillar contact structures 144 may individually be substantially homogeneous, or one or more of the first pillar contact structures 144 may individually be heterogeneous.

Still referring to FIG. 3, for each MUX device 116, the second pillar contact structure 146 thereof may contact (e.g., physically contact, electrically contact) the channel material 150 of the pillar structure 142 thereof. In some embodiments, for each MUX device 116, an upper boundary (e.g., an upper surface) of the second pillar contact structure 146 thereof vertically overlies a lower boundary (e.g., a lower surface) of the channel material 150 of the pillar structure 142 thereof. The upper boundary of the second pillar contact structure 146 may vertically overlie a lower boundary (e.g., a lower surface) of the gate dielectric material 148 of the MUX device 116, such that the second pillar contact structure 146 at least partially (e.g., substantially) covers outer side surfaces (e.g., outer sidewalls) of the gate dielectric material 148. In additional embodiments, the upper boundary of the second pillar contact structure 146 is substantially coplanar with the lower boundary of the channel material 150 of the pillar structure 142 thereof. Horizontal dimensions of the second pillar contact structure 146 of an individual MUX device 116 may be greater than horizontal dimensions of the first pillar contact structure 144 of the MUX device 116. In addition, a volume of the second pillar contact structure 146 of an individual MUX device 116 may be greater than a volume of the first pillar contact structure 144 of the MUX device 116. In some embodiments, for each MUX device 116, the upper boundary of the second pillar contact structure 146 thereof vertically overlies (e.g., in the Z-direction) an upper boundary (e.g., an upper surface) of an uppermost conductive structure 130 within vertical boundaries of the access line region 136 of the stack structure 128; and a lower boundary of the second pillar contact structure 146 vertically underlies (e.g., in the Z-direction) a lower boundary (e.g., a lower surface) of the uppermost conductive structure 130 within the vertical boundaries of the access line region 136 of the stack structure 128. In additional embodiments, for each MUX device 116, the upper boundary of the second pillar contact structure 146 thereof is positioned at or vertically below (e.g., in the Z-direction) the upper boundary of the uppermost conductive structure 130 within the vertical boundaries of the access line region 136 of the stack structure 128. In further embodiments, for each MUX device 116, the lower boundary of the second pillar contact structure 146 is positioned at or vertically above (e.g., in the Z-direction) the lower boundary of the uppermost conductive structure 130 within the vertical boundaries of the access line region 136 of the stack structure 128, such as at or vertically above the upper boundary of the uppermost conductive structure 130 within the vertical boundaries of the access line region 136 of the stack structure 128.

The second pillar contact structure 146 of each of the MUX devices 116 may be formed of and include conductive material. As a non-limiting example, the second pillar contact structures 146 may each individually be formed of and include one or more of at least one conductively doped semiconductor material, at least one metal, at least one alloy, and at least one conductive metal-containing material (e.g., a conductive metal nitride, a conductive metal silicide, a conductive metal carbide, a conductive metal oxide). For an individual MUX device 116, a material composition of the second pillar contact structure 146 thereof may be substantially the same as or different than a material composition of the first pillar contact structure 144 thereof. In some embodiments, each second pillar contact structure 146 is formed of and includes polycrystalline silicon doped with one or more conductivity-enhancing dopants (e.g., one or more N-type dopants, one or more P-type dopants). Each of the second pillar contact structures 146 may individually be substantially homogeneous, or one or more of the second pillar contact structures 146 may individually be heterogeneous.

With continued reference to FIG. 3, the first contact structures 118 may vertically overlie and contact (e.g., physically contact, electrically contact) the first pillar contact structures 144 of the MUX devices 116. For each first MUX device 116A, a first contact structure 118 vertically overlying and contacting the first pillar contact structure 144 of the first MUX device 116A may couple the first MUX device 116A to an individual first digit line 110. In addition, for each second MUX device 116B, a first contact structure 118 vertically overlying and contacting the first pillar contact structure 144 of the second MUX device 116B may couple the second MUX device 116B to an individual second digit line 112.

The first contact structures 118 may be formed of and include conductive material. As a non-limiting example, the first contact structures 118 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). As shown in FIG. 3, in some embodiments, the first contact structures 118 each include a first conductive plug structure 156, and a first conductive liner structure 158 at least partially surrounding the first conductive plug structure 156. The first conductive liner structure 158 may, for example, substantially cover and surround a bottom surface and side surfaces of the first conductive plug structure 156. The first conductive liner structure 158 may be interposed between the first conductive plug structure 156 and the first pillar contact structure 144 of the MUX device 116 (e.g., the first MUX device 116A, the second MUX device 116B) underlying and coupled to the first contact structure 118. A material composition of the first conductive liner structure 158 may be different than a material composition of the first conductive plug structure 156. In some embodiments, the first conductive plug structure 156 of each first contact structure 118 is formed of and includes elemental metal (e.g., elemental W), and the first conductive liner structure 158 of each first contact structure 118 is formed of and includes conductive metal nitride (e.g., $TiN_x$). In additional embodiments, the first conductive liner structure 158 is omitted from one or more (e.g., each) of the first contact structures 118. Each first contact structure 118 may, for example, only include a first conductive plug structure 156.

With continued reference to FIG. 3, third contact structures 164 may be formed to electrically connect the first contact structures 118 coupled to the first MUX device 116A to the first digit lines 110, and to electrically connect the first contact structures 118 coupled to the second MUX device 116B to the second digit lines 112. For each first MUX device 116A, a third contact structure 164 vertically overlying and contacting an individual first contact structure 118 coupled to the first MUX device 116A may couple the first contact structure 118 (and, hence, the first MUX device 116A) to an individual first digit line 110. In addition, for each second MUX device 116B, a third contact structure 164 vertically overlying and contacting an individual first contact structure 118 coupled to the second MUX device 116B may couple the first contact structure 118 (and, hence, the second MUX device 116B) to an individual second digit line 112.

The third contact structures 164 may be formed of and include conductive material. As a non-limiting example, the third contact structures 164 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). As shown in FIG. 3, in some embodiments, the third contact structures 164 each include a second conductive plug structure 160, and a second conductive liner structure 162 at least partially surrounding the second conductive plug structure 160. The second conductive liner structure 162 may, for example, substantially cover and surround a bottom surface and side surfaces of the second conductive plug structure 160. The second conductive liner structure 162 may be interposed between the second conductive plug structure 160 and the first conductive plug structure 156 of the first contact structure 118 underlying and coupled to the third contact structure 164. A material composition of the second conductive liner structure 162 may be different than a material composition of the second conductive plug structure 160. In some embodiments, the second conductive plug structure 160 of each third contact structure 164 is formed of and includes elemental metal (e.g., elemental W), and the second conductive liner structure 162 of each third contact structure 164 is formed of and includes conductive metal nitride (e.g., $TiN_x$). In additional embodiments, the second conductive liner structure 162 is omitted from one or more (e.g., each) of the third contact structures 164. Each third contact structure 164 may, for example, only include a second conductive plug structure 160.

Still referring to FIG. 3, the second contact structures 120 may vertically underlie and contact (e.g., physical contact, electrically contact) the second pillar contact structures 146 of the MUX devices 116. For each first MUX device 116A, a second contact structure 120 vertically underlying and electrically connected to the second pillar contact structure 146 of the first MUX device 116A may couple the first MUX device 116A to one or more of the conductive routing structures 122 vertically underlying the stack structure 128. In addition, for each second MUX device 116B, a second contact structure 120 vertically underlying and electrically connected to the second pillar contact structure 146 of the second MUX device 116B may couple the second MUX device 116B to the conductive routing structure 122 vertically underlying the stack structure 128. As shown in FIG. 3, the second contact structures 120 may vertically extend through portions of the stack structure 128 vertically underlying the stack structure 128. Lower vertical boundaries (e.g., lower surfaces in the Z-direction) of the may be positioned at or below lower vertical boundaries of the stack structure 128. In some embodiments, a lower vertical boundary of each second contact structure 120 is positioned vertically below a lower vertical boundary of a vertically lowest conductive structure 130 within the second select gate region 140 of the stack structure 128.

The second contact structures 120 may individually be formed of and include conductive material. As a non-limiting example, the second contact structures 120 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the second contact structures 120 are formed of and include elemental metal (e.g., elemental W).

Still referring to FIG. 3, at least one conductive liner material 170 may at least partially surround the second pillar contact structures 146 of the MUX devices 116, as well as the second contact structures 120 vertically thereunder. For each MUX device 116 (e.g., each first MUX device 116A, each second MUX device 116B), the conductive liner material 170 may substantially cover and surround a bottom surface (e.g., a lower surface) and side surfaces of the second pillar contact structure 146 thereof, and may also substantially cover and surround a top surface (e.g., an upper surface) and side surfaces of the second contact structure 120 vertically underlying and coupled to the second pillar contact structure 146. For an individual second pillar contact structure 146 and an individual second contact structure 120 operatively associated with the second pillar contact structure 146, vertically extending portions of the conductive liner material 170 may be horizontally interposed between the stack structure 128 (including the conductive structures 130 and insulative structures 132 thereof) and each of the second pillar contact structure 146 and the second contact structure 120; and horizontally extending portions of the conductive liner material 170 may be vertically interposed between the second pillar contact structure 146 and the second contact structure 120. As shown in FIG. 3, in some embodiments, a horizontal thickness of a portion of the conductive liner material 170 horizontally surrounding an individual second pillar contact structure 146 is greater than a horizontal thickness of an additional portion of the conductive liner material 170 horizontally surrounding an individual second contact structure 120 vertically underlying and coupled to the second pillar contact structure 146.

The conductive liner material 170 may be formed of and include conductive material. As a non-limiting example, the conductive liner material 170 be formed of and include a metallic material comprising one or more of at least one metal, at least one alloy, and at least one conductive metal-containing material (e.g., a conductive metal nitride, a conductive metal silicide, a conductive metal carbide, a conductive metal oxide). A material composition of the conductive liner material 170 may be different than material compositions of the second pillar contact structures 146 and the second contact structures 120. In some embodiments, the conductive liner material 170 is formed of and includes conductive metal nitride (e.g., $TiN_x$).

With continued reference to FIG. 3, the second pillar contact structures 146, the second contact structures 120, and the conductive liner material 170 may be electrically isolated from the conductive structures 130 of the tiers 134 of the stack structure 128 by way of at least one dielectric liner material 172. The dielectric liner material 172 may horizontally intervene between the stack structure 128 and each of second pillar contact structures 146, and may also horizontally intervene between the stack structure 128 and each the second contact structures 120. As shown in FIG. 3, the dielectric liner material 172 may horizontally intervene between the conductive liner material 170 and the stack structure 128. The dielectric liner material 172 may continuously extend over and substantially cover outer side surfaces of the conductive liner material 170.

The dielectric liner material 172 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric liner material 172 is formed of and includes at least one dielectric oxide material (e.g., $SiO_x$, such as $SiO_2$).

With continued reference to FIG. 3, the conductive pad structures 166 may vertically underlie and contact (e.g., physical contact, electrically contact) the second contact structures 120, and fourth contact structures 168 may vertically underlie and contact (e.g., physical contact, electrically contact) the conductive pad structures 166. The conductive pad structures 166 and the fourth contact structures 168 may together couple the second contact structures 120 (and, hence, the MUX devices 116) to the conductive routing structures 122 vertically underlying the stack structure 128. As shown in FIG. 3, the second contact structures 120 may physically contact (e.g., land on) the conductive pad structures 166, and the fourth contact structures 168 may vertically extend from the conductive pad structures 166 to the conductive routing structures 122. Optionally, the conductive liner material 170 and the dielectric liner material 172 surrounding each of the second contact structures 120 (and each of the second pillar contact structures 146 of the MUX devices 116) may also physically contact (e.g., land on) the conductive pad structures 166.

The conductive pad structures 166 and the fourth contact structures 168 may each individually be formed of and include conductive material. By way of non-limiting example, the conductive pad structures 166 and the fourth contact structures 168 may each individually be formed of and include one or more of at least one metal, at least one alloy, and at least one conductive metal-containing material (e.g., a conductive metal nitride, a conductive metal silicide, a conductive metal carbide, a conductive metal oxide). A material composition of the conductive pad structures 166 may be different than a material composition of the fourth contact structures 168, or the material composition of the conductive pad structures 166 may be substantially the same as the material composition of the fourth contact structures 168. In some embodiments, the conductive pad structures 166 are individually formed of and include conductive metal nitride (e.g., $TiN_x$), and the fourth contact structures 168 are individually formed of and include elemental metal (e.g., elemental W).

Still referring to FIG. 3, for each pair of the MUX devices 116 including a first MUX device 116A coupled to a first digit line 110 and a second MUX device 116B coupled to a second digit line 112 horizontally aligned (e.g., in the X-direction) with the first digit line 110, at least one of the conductive routing structures 122 vertically underlying the stack structure 128 may couple the first MUX device 116A and the second MUX device 116B to one another and to one or more of the page buffer devices 124 (FIG. 2) of the microelectronic device structure 100. The conductive routing structures 122 may be formed of and include conductive material. As a non-limiting example, the conductive routing structures 122 be individually formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive routing structures 122 are individually formed of and include elemental metal (e.g., elemental W).

With returned reference to FIG. 1, as previously discussed, desired quantities of the first digit lines 110 and the second digit lines 112 may be formed by cutting some (e.g., eight (8) of thirty-two (32)) preliminary digit lines while maintaining some other (e.g., twenty-four (24) other of the thirty-two (32)) preliminary digit lines horizontally neighboring the some preliminary digit lines. Optionally, to mitigate risks associated with undesirable damage to preliminary digit lines to be maintained (e.g., preliminary digit lines most horizontally proximate a group of preliminary digit lines to be cut) that may result from the cutting process, redundant conductive paths may be formed between different portions of individual preliminary digit lines to be maintained. For example, an individual preliminary digit line to be maintained, so as to effectively become an additional digit line horizontally neighboring one of the first digit lines 110 and one of the second digit lines 112, may have a first portion thereof connected to a second portion thereof by way of a redundant conductive path. Accordingly, if the cutting process undesirably segments the preliminary digit line, so as to physically separate the first portion from the second portion, the redundant conductive path may still electrically connect the first portion to the second portion. The first portion of the preliminary digit line may be within horizontal boundaries in the Y-direction of the first digit lines 110, and the second portion of the preliminary digit line may be within horizontal boundaries in the Y-direction of the second digit lines 112. An individual redundant conductive path may, for example, comprise one of the second contact structures 120 coupled to the first portion of an individual preliminary digit line, another one of the second contact structures 120 coupled to the second portion of the individual preliminary digit line, and one of the conductive routing structures 122 extending between and coupling the one of the second contact structures 120 and the another one of the second contact structures 120.

Figure 4:
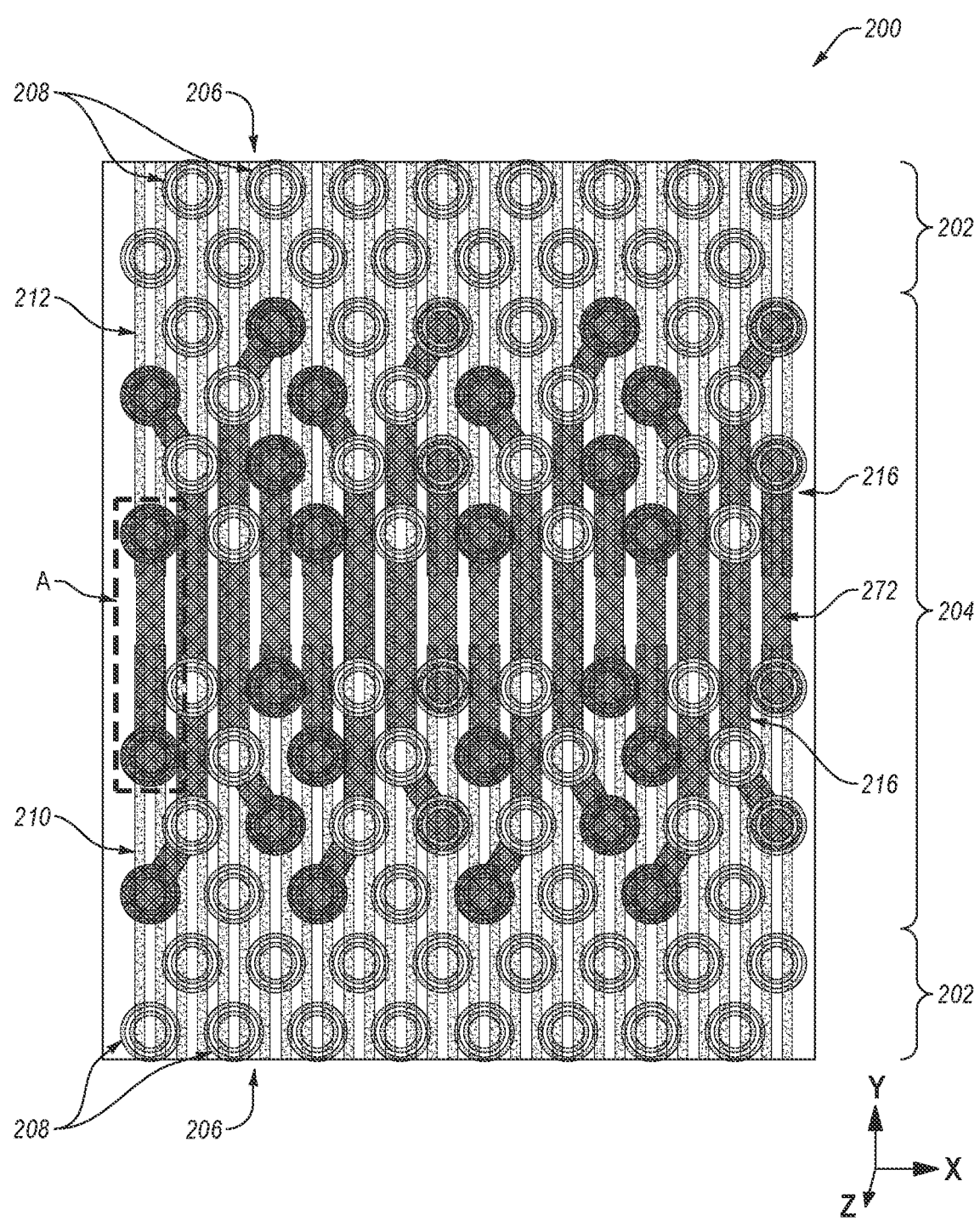
FIG. 4 is simplified, partial plan view of a microelectronic device structure, in accordance with additional embodiments of the disclosure.
Figure 5:
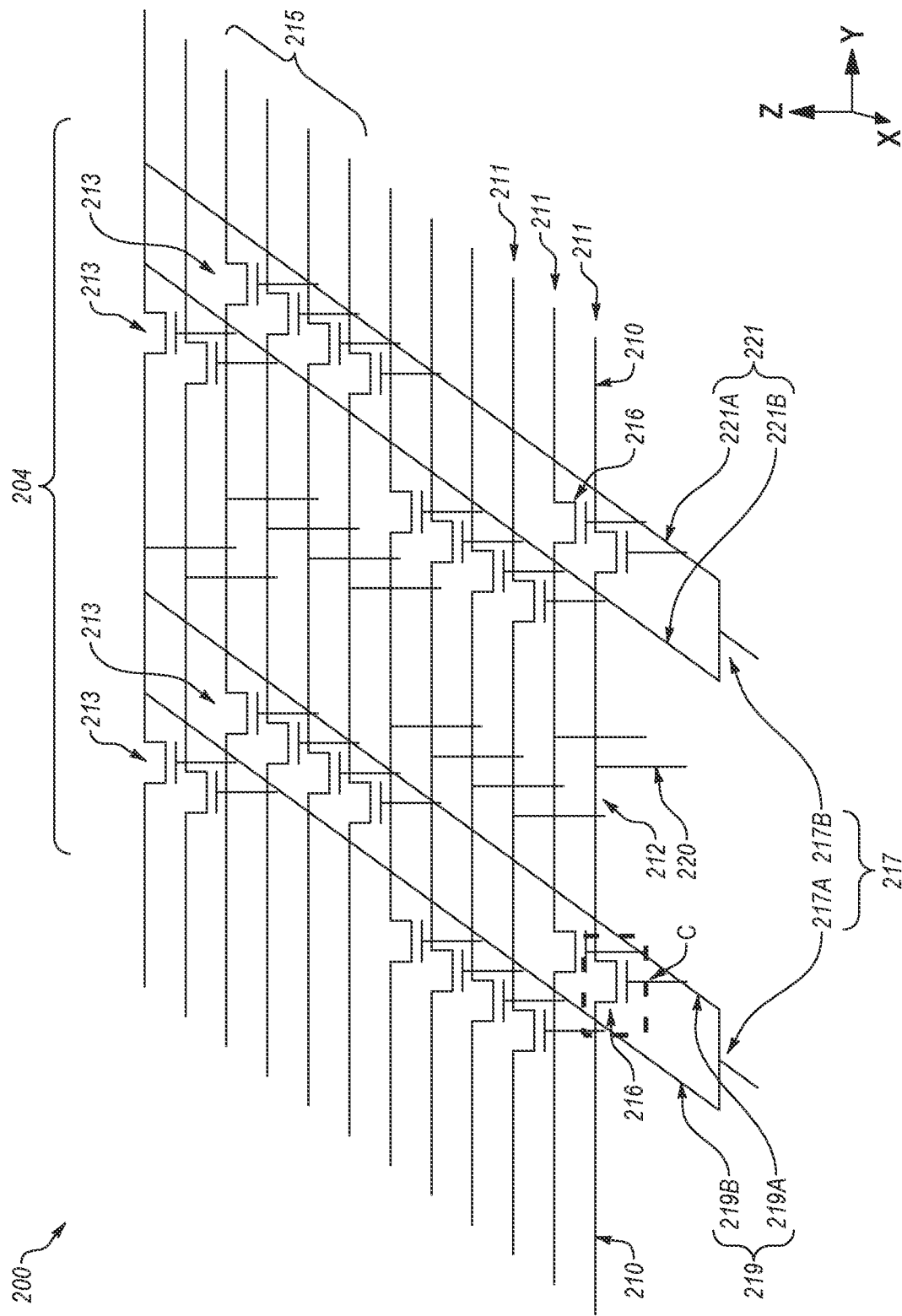
FIG. 5 is simplified, partial perspective view of the microelectronic device structure shown in FIG. 4.
Figure 6:
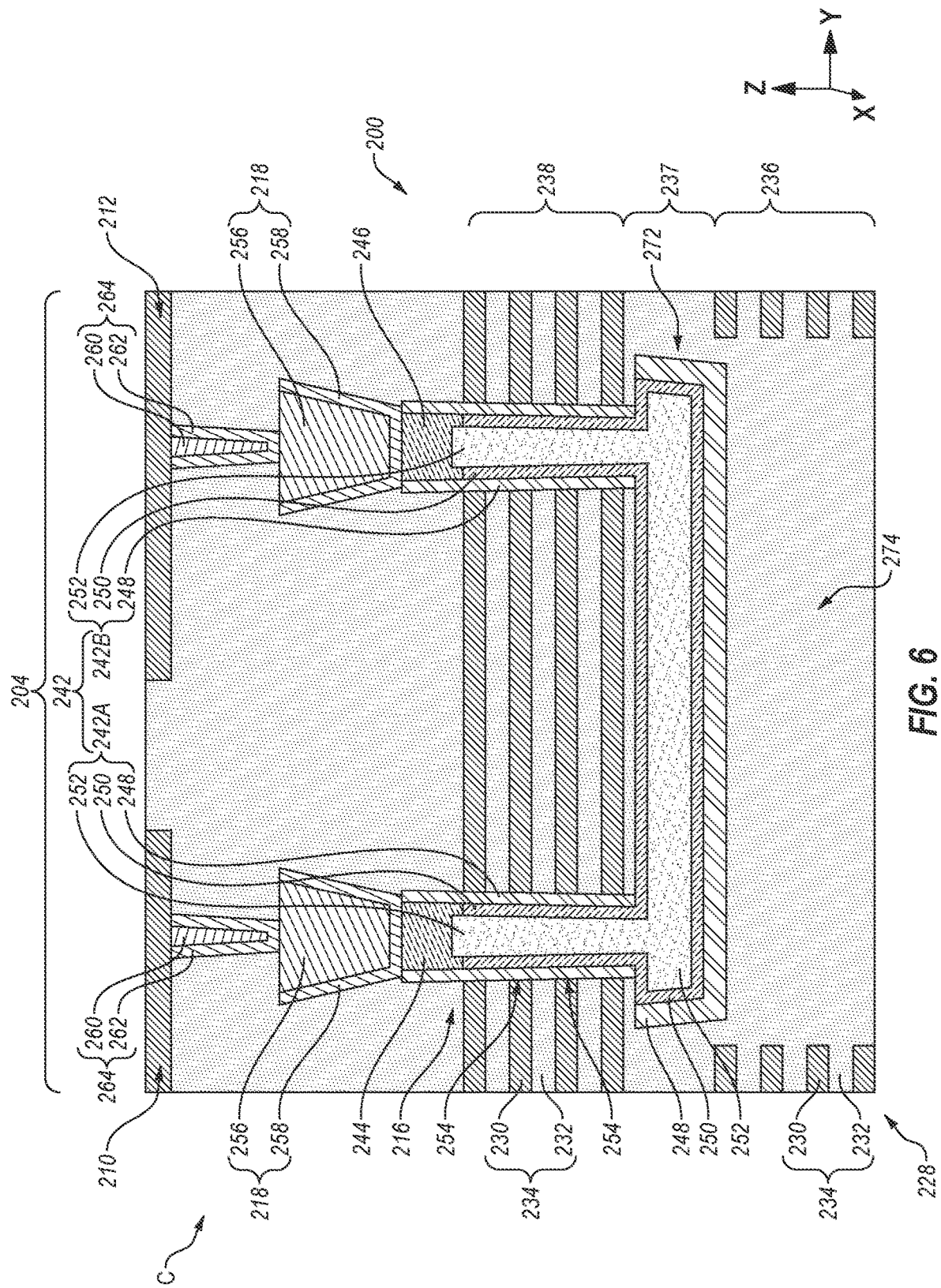
FIG. 6 is simplified, partial cross-sectional view of a section of the microelectronic device structure shown in FIGS. 4 and 5.

In additional embodiments, the microelectronic device structure 100 may be formed to have a different configuration than that previously described with reference to FIGS. 1 through 3. The microelectronic device structure 100 may, for example, be formed to have different configuration(s) of one or more features (e.g., structures, devices) within the additional region 104 thereof than the configurations previously described with reference to FIGS. 1 through 3. By way of non-limiting example, FIG. 4 is simplified, partial plan view of a microelectronic device structure 200 for a microelectronic device (e.g., a memory device, such as a NAND Flash memory device), in accordance with additional embodiments of the disclosure. FIG. 5 is simplified, partial perspective view of the microelectronic device structure 200 shown in FIG. 4. FIG. 6 is simplified, partial cross-sectional view of a section C (depicted by way of dashed lines in FIG. 5) of the microelectronic device structure 200 shown in FIGS. 4 and 5.

Throughout FIGS. 4 through 6 and the associated description, features (e.g., materials, structures, devices) functionally similar previously described features (e.g., previously described materials, structures, devices) are referred to with similar reference numerals incremented by 100. To avoid repetition, not all features shown in FIGS. 4 through 6 are described in detail herein. Rather, unless described otherwise below, a feature in one or more of FIGS. 4 through 6 designated by a reference numeral that is a 100 increment of the reference numeral of a feature previously described with reference to one or more of FIGS. 1 through 3 will be understood to be substantially similar to the previously described feature. As a non-limiting example, unless described otherwise below, features designated by the reference numeral 210 in FIGS. 4 through 6 will be understood to be substantially similar to the first digit lines 110 previously described herein with reference to FIGS. 1 through 3. As another non-limiting example, unless described otherwise below, features designated by the reference numeral 212 in FIGS. 4 through 6 will be understood to be substantially similar to the second digit lines 112 previously described herein with reference to FIGS. 1 through 3. In addition, unless described otherwise below, features of the microelectronic device structure 100 previously described with reference to FIGS. 1 through 3 may also be included, in substantially the same manner (e.g., so as to exhibit substantially similar configurations and positions), within the microelectronic device structure 200 described herein with reference to FIGS. 4 through 6. For clarity and ease of understanding of the drawings and related description, not all components (e.g., features, structures, devices) of the microelectronic device structure 200 depicted in one or more of FIGS. 4 through 6 are depicted in one or more other of FIGS. 4 through 6. With the description provided below, it will be readily apparent to one of ordinary skill in the art that the structures and devices described herein may be included in relatively larger structures, devices, and systems.

Referring to FIG. 4, the microelectronic device structure 200 may include MUX devices 216 having different configurations than the MUX devices 116 of the microelectronic device structure 100 previously described with reference to FIGS. 1 through 3. As described in further detail below, each MUX device 216 may individually be coupled to a first digit line 210 and a second digit line 212 horizontally aligned (e.g., in the X-direction) with the first digit line 210. Each MUX device 216 may provide the same function as an individual pair of the MUX devices 116 (e.g., a first MUX device 116A, a second MUX device 116B) previously described with reference FIGS. 1 through 3. However, as a result of the different configurations of the MUX devices 216 relative to the MUX devices 116 (FIG. 3), at least some of the second contact structures 120 (FIG. 3) and at least some portions of the conductive routing structures 122 (FIG. 3) operatively associated with the MUX devices 116 (FIG. 3) of the microelectronic device structure 100 may be absent (e.g., omitted) from the microelectronic device structure 200.

A pattern of the first digit lines 210 and the second digit lines 212 exhibited by the microelectronic device structure 200 may be different than a pattern of the first digit lines 110 (FIG. 1) and the second digit lines 112 (FIG. 1) exhibited by the microelectronic device structure 100 (FIG. 1). For example, as shown in FIG. 4, at least one group of the first digit lines 210 may include four (4) first digit lines 210 horizontally terminating at substantially the same horizontal position (e.g., in the Y-direction) within the additional region 204 of the microelectronic device structure 200; and at least one group of the second digit lines 212 horizontally aligned (e.g., in the X-direction) with the at least one group of the first digit lines 210 may include four (4) of the second digit lines 212 horizontally terminating at substantially the same horizontal position (e.g., in the Y-direction) within the additional region 204 of the microelectronic device structure 200. In some embodiments, the microelectronic device structure 200 includes multiple (e.g., more than one) groups of four (4) first digit lines 210 and multiple groups of four (4) second digit lines 212 terminating at substantially the same first horizontal position (e.g., in the Y-direction) within the additional region 204 of the microelectronic device structure 200; and also includes multiple additional groups of four (4) first digit lines 210 and multiple additional groups of four (4) second digit lines 212 terminating at substantially the same second horizontal position (e.g., in the Y-direction) within the additional region 204 of the microelectronic device structure 200, wherein the first horizontal position is horizontally offset (e.g., in the Y-direction) from the second horizontal position. The multiple groups of four (4) first digit lines 210 and the multiple groups of four (4) second digit lines 212 may horizontally alternate (e.g., in the X-direction) with the multiple additional groups of four (4) first digit lines 210 and the multiple additional groups of four (4) second digit lines 212. In additional embodiments, at least one group of the first digit lines 210 includes a different quantity (e.g., less than four (4), greater than four (4)) of first digit lines 210 horizontally terminating at substantially the same horizontal position (e.g., in the Y-direction) within the additional region 204 of the microelectronic device structure 200; and at least one group of the second digit lines 212 horizontally aligned (e.g., in the X-direction) with the at least one group of the first digit lines 210 includes a different quantity (e.g., less than four (4), greater than four (4)) of the second digit lines 212 horizontally terminating at substantially the same horizontal position (e.g., in the Y-direction) within the additional region 204 of the microelectronic device structure 200.

Referring to FIG. 5, within the additional region 204 of the microelectronic device structure 200, multiple MUX devices 216 may be aligned with one another in the X-direction to form columns 211 of the MUX devices 216 extending in the Y-direction. Each MUX device 216 within an individual column 211 of the MUX devices 216 may individually be horizontally interposed between and coupled to a first digit line 210 and a second digit line 212 aligned with the MUX device 216 in the X-direction. Multiple first digit lines 210 and/or multiple second digit lines 212 may be operatively associated with each column 211 of the MUX devices 216. As shown in FIG. 5, within an individual column 211 of the MUX devices 216, a pair of (e.g., two (2)) MUX devices 216 horizontally neighboring one another in the Y-direction may be coupled to the same (e.g., a common) second digit line 212 as one another, and may also be coupled to different first digit lines 210 than one another. The second digit line 212 may horizontally extend in the Y-direction from and between the pair of MUX devices 216, and the first digit lines 210 may horizontally extend in the Y-direction from the pair of the MUX devices 216 to strings of memory cells 208 (FIG. 4) within columns of the strings of memory cells 208 (FIG. 4) within the memory array regions 202 (FIG. 4) of the microelectronic device structure 200. In additional embodiments, a pair of (e.g., two (2)) MUX devices 216 horizontally neighboring one another in the Y-direction within an individual column 211 of the MUX devices 216 are coupled to the same (e.g., a common) first digit line 210 as one another, and are coupled to different second digit lines 212 than one another. The first digit line 210 may horizontally extend in the Y-direction from and between the pair of MUX devices 216, and the second digit lines 212 may horizontally extend in the Y-direction from the pair of the MUX devices 216 to strings of memory cells 208 (FIG. 4) within columns of the strings of memory cells 208 (FIG. 4) within the memory array regions 202 (FIG. 4) of the microelectronic device structure 200.

Still referring to FIG. 5, within an individual column 211 of the MUX devices 216, the second digit line 212 (or the first digit line 210) shared between a pair of MUX devices 216 horizontally neighboring one another in the Y-direction may be coupled to at least one second contact structure 220. The second contact structures 220 may be employed in place of the second contact structures 120 (FIGS. 2 and 3) of the microelectronic device structure 100 previously described herein with reference to FIGS. 1 through 3, and may be horizontally offset (e.g., in the Y-direction) from the MUX devices 216 within an individual column of the MUX devices 216. The second contact structures 220 may vertically extend between and couple individual second digit lines 212 (or individual first digit lines 210) to one or more underlying conductive routing structures (e.g., corresponding to the conductive routing structures 122 (FIGS. 2 and 3)). The conductive routing structures may be coupled to page buffer devices (e.g., corresponding to the page buffer devices 124 (FIG. 2)) and, optionally, isolation devices (e.g., corresponding to the isolation devices 126 (FIG. 2)), of the microelectronic device structure 200. Accordingly, each second contact structures 220 may couple, by way of a common (e.g., shared) second digit line 212 (or a common first digit line 210), a pair of the MUX devices 216 within an individual column 211 of MUX devices 216 to conductive routing structures positioned vertically thereunder.

With continued reference to FIG. 5, within the additional region 204 of the microelectronic device structure 200, multiple MUX devices 216 may be aligned with one another in the X-direction to form rows 213 of the MUX devices 216 extending in the X-direction. Each MUX device 216 within an individual row 213 of the MUX devices 216 may be coupled to a different first digit line 210 and a different second digit line 212 than each other MUX device 216 within the individual row 213 of the MUX devices 216. The MUX devices 216 within each row 213 may be arranged in groups 215 spaced apart (e.g., separated) from one another within the row 213. For an individual row 213 of the MUX devices 216, a quantity of MUX devices 216 within an individual group 215 may correspond to a quantity of the first digit lines 210 (and, hence, a quantity of the second digit lines 212) terminating at or proximate the group 215. As shown in FIG. 5, in some embodiments, each group 215 of MUX devices 216 within an individual row 213 of the MUX devices 216 includes four (4) of the MUX devices 216. In additional embodiment, one or more group(s) 215 of the MUX devices 216 within an individual row 213 of the MUX devices 216 individually includes a different quantity (e.g., greater than four (4), less than four (4)) of the MUX devices 216. Each group 215 of the MUX devices 216 within an individual row 213 may be horizontally separated, in the X-direction, from each other group 215 of MUX devices 216 within the row 213 that horizontally neighbor, in the X-direction, the group 215 by a group of the first digit lines 210 (and, hence, a group of the second digit lines 212) that do not terminate at or proximate a horizontal position of the row 213 in the Y-direction. As a non-limiting example, within an individual row 213 of the MUX devices 216, a group of four (4) of the first digit lines 210 (and, hence, a group of four (4) of the second digit lines 212) may be horizontally interposed, in the X-direction, between two (2) groups 215 of the MUX devices 216 horizontally neighboring one another within the row 213.

As shown in FIG. 5, groups 215 of the MUX devices 216 within different, horizontally neighboring rows 213 of the MUX devices 216 than one another may be horizontally offset from one another in the X-direction. For example, at least one of the groups 215 of the MUX devices 216 within an individual row 213 of the MUX devices 216 may be horizontally offset, in the X-direction, from at least one other of the groups 215 of the MUX devices 216 most horizontally proximate thereto and within another individual row 213 of the MUX devices 216 horizontally neighboring the individual row 213 of the MUX devices 216 in the Y-direction. In some embodiments, all of the MUX devices 216 within at least one (e.g., each) row 213 of the MUX devices 216 are horizontally offset, in the X-direction, from all of the MUX devices 216 within at least one (e.g., each) other row 213 of the MUX devices 216 horizontally neighboring the at least one row 213 of the MUX devices 216 in the Y-direction.

Still referring to FIG. 5, the microelectronic device structure 200 may further include digit line selector devices 217 electrically connected to the MUX devices 216. The digit line selector devices 217 may include a first digit line selector device 217A and a second digit line selector device 217B. The first digit line selector device 217A may be coupled to select lines 219 electrically connected to the MUX devices 216 of a first horizontally neighboring pair of the rows 213 of the MUX devices 216; and the second digit line selector device 217B may be coupled to additional select lines 221 electrically connected to the MUX devices 216 of a second horizontally neighboring pair of the rows 213 of the MUX devices 216. The select lines 219 may include a first select line 219A coupled to the MUX devices 216 of one of the rows 213 of the first horizontally neighboring pair of the rows 213; and a second select line 219B extending parallel to the first select line 219A and coupled to the MUX devices 216 of another one of the rows 213 of the first horizontally neighboring pair of the rows 213. The additional select lines 221 may include a first additional select line 221A coupled to the MUX devices 216 of one of the rows 213 of the second horizontally neighboring pair of the rows 213; and a second additional select line 221B extending parallel to the first additional select line 219A and coupled to the MUX devices 216 of another one of the rows 213 of the second horizontally neighboring pair of the rows 213. For each column of the MUX devices 216, one of the MUX devices 216 of the column may be coupled to the first digit line selector device 217A by way of one of the select lines 219 (e.g., the first select line 219A, or the second select line 219B), and another one of the MUX devices 216 of the column may be coupled to the second digit line selector device 217B by way of one of the additional select lines 221 (e.g., the first additional select line 221A, or the second additional select line 221B). The first digit line selector device 217A may facilitate the activation (e.g., an active state, an ON state) of one of the MUX devices 216 of the column of the MUX devices 216 while the second digit line selector device 217B facilitates the deactivation (e.g., an inactive state, an OFF state) of another one of the MUX devices 216 of the column of the MUX devices 216, and vice versa.

Referring next to FIG. 6, each MUX device 216 may be formed to include two (2) pillar structures 242, including a first pillar structure 242A and a second pillar structure 242B; a connection portion 272 (also referred to herein as a "routing portion") vertically underlying and horizontally extending from and between the first pillar structure 242A and the second pillar structure 242B; a first pillar contact structure 244 vertically overlying the first pillar structure 242A; and a second pillar contact structure 246 vertically overlying the second pillar structure 242B. For each MUX device 216, conductive structures 230 of the tiers 234 of the stack structure 228 within the first select gate region 238 of the stack structure 228 may contact (e.g., physically contact, electrically contact) the pillar structures 242 (e.g., the first pillar structure 242A, and the second pillar structure 242B) of the MUX device 216 to form transistors of the MUX device 216, as described in further detail below. In addition, for each MUX device 216, the connection portion 272 thereof may be integral and continuous with each of the pillar structures 242 thereof, and may be at least partially (e.g., substantially) positioned within the isolation region 237 vertically interposed between the access line region 236 and the first select gate region 238 of the stack structure 228. As shown in FIG. 6, for each MUX device 216, the first pillar contact structure 244 thereof may be interposed between the first pillar structure 242A thereof and one of the first contact structures 218 coupled to one of the first digit lines 210; and the second pillar contact structure 246 thereof may be interposed between the second pillar structure 242B thereof and an additional one of the first contact structures 218 coupled to one of the second digit lines 212.

For each MUX device 216, the pillar structures 242 thereof, including the first pillar structure 242A and the second pillar structure 242B, may individually be formed of and include a stack of materials corresponding to the stack of materials of the pillar structure 142 (FIG. 3) of each of the MUX devices 116 (FIG. 3) of the microelectronic device structure 100 (FIGS. 1 through 3). For example, the pillar structures 242 of an individual MUX device 216 may each include a gate dielectric material 248, a channel material 250, and a dielectric fill material 252. The gate dielectric material 248 may be horizontally interposed between the channel material 250 and the conductive structures 230 of the tiers 234 of the stack structure 228 within the first select gate region 238 of the stack structure 228. The channel material 250 may be horizontally interposed between the gate dielectric material 248 and the dielectric fill material 252. For each of the two (2) pillar structures 242 of an MUX device 216, the dielectric fill material 252 thereof may be outwardly horizontally surrounded by the channel material 250 thereof; and the channel material 250 thereof may be outwardly horizontally surrounded by the gate dielectric material 248 thereof.

For each MUX device 216 of the microelectronic device structure 200, intersections of the pillar structures 242 (e.g., the first pillar structure 242A, the second pillar structure 242B) thereof and the conductive structures 230 of at least some of the tiers 234 of the stack structure 228 within the first select gate region 238 may define transistors 254 of the MUX device 216. In some embodiments, the transistors 254 of an individual MUX device 216 comprise MOS transistors. If the conductive structures 230 of the tiers 234 of the stack structure 228 within the first select gate region 238 are employed as SGDs for the microelectronic device structure 200, the transistors 254 of an individual MUX device 216 may comprise MOS-SGD transistors, and the MUX device 216 may comprise a MOS-SGD MUX device.

Still referring to FIG. 6, for each MUX device 216, the connection portion 272 thereof may include the stack of materials from which the pillar structures 242 of the MUX device 216 are formed. For example, the connection portion 272 of an individual MUX device 216 may also include the gate dielectric material 248, the channel material 250, and the dielectric fill material 252. The channel material 250 of the connection portion 272 of the MUX device 216 may be integral and continuous with the channel material 250 of each of the pillar structures 242 of the MUX device 216; and the dielectric fill material 252 of the connection portion 272 of the MUX device 216 may be integral and continuous with the dielectric fill material 252 of each of the pillar structures 242 of the MUX device 216. As shown in FIG. 6, in some embodiments, the gate dielectric material 248 of the connection portion 272 of the MUX device 216 is discontinuous with the gate dielectric material 248 of each of the pillar structures 242 of the MUX device 216. For example, a portion of an insulative structures 232 of one of the tiers 234 (e.g., a lowermost tier 234) of the stack structure 228 within the first select gate region 238 of the stack structure 228 may be interposed between and may separate the gate dielectric material 248 of the connection portion 272 of the MUX device 216 and the gate dielectric material 248 of each of the pillar structures 242 of the MUX device 216. In additional embodiments, the gate dielectric material 248 of the connection portion 272 of each MUX device 216 is integral and continuous with the gate dielectric material 248 of each of the pillar structures 242 of the MUX device 216. The gate dielectric material 248 of the connection portion 272 of an individual MUX device 216 may be at least partially interposed between the channel material 250 of the connection portion 272 and insulative material(s) within the isolation region 237 and the access line region 236 of the stack structure 228. In addition, the channel material 250 of the connection portion 272 of the MUX device 216 may be interposed between the gate dielectric material 248 of the connection portion 272 and the dielectric fill material 252 of the connection portion 272.

With collective reference to FIGS. 4 and 6, for each MUX device 216 of the microelectronic device structure 200, the connection portion 272 thereof may exhibit a desired horizontal area and a desired horizontal cross-sectional shape extending from and between the pillar structures 242 thereof. The horizontal areas and the horizontal cross-sectional shapes of the connection portions 272 of at least some of the MUX devices 216 of the microelectronic device structure 200 may be different than the horizontal areas and the horizontal cross-sectional shapes of the connection portions 272 of at least some other of the MUX devices 216 of the microelectronic device structure 200. The horizontal area and the horizontal cross-sectional shape of the connection portion 272 of an individual MUX device 216 may be selected at least partially based on the horizontal area and the horizontal cross-sectional shape of the connection portion 272 of each other MUX device 216 horizontally neighboring the individual MUX device 216, as well as on the configurations and positions of other features (e.g., the first digit lines 210, the second digit lines 212) of the microelectronic device structure 200. As shown in FIG. 4, in some embodiments, the connection portions 272 of some of the MUX devices 216 horizontally extend in substantially linear paths within the microelectronic device structure 200; and the connection portions 272 of some other of the MUX devices 216 horizontally extend in at least partially non-linear paths within the microelectronic device structure 200.

Referring to FIG. 6, for each MUX device 216, the first pillar contact structure 244 thereof may contact (e.g., physically contact, electrically contact) the channel material 250 of the first pillar structure 242A thereof; and the second pillar contact structure 246 thereof may contact (e.g., physically contact, electrically contact) the channel material 250 of the second pillar structure 242B thereof. In some embodiments, for each MUX device 216, a lower boundary (e.g., a lower surface) of the first pillar contact structure 244 thereof is substantially coplanar with an upper boundary (e.g., an upper surface) of the channel material 250 of the first pillar structure 242A thereof and a lower boundary (e.g., a lower surface) of the second pillar contact structure 246 thereof is substantially coplanar with an upper boundary (e.g., an upper surface) of the channel material 250 of the second pillar structure 242B thereof. The lower boundaries of the first pillar contact structure 244 and the second pillar contact structure 246 may vertically underlie upper boundaries (e.g., upper surfaces) of the gate dielectric material 248 of the MUX device 216, such that the gate dielectric material 248 of the MUX device 216 at least partially (e.g., substantially) covers side surfaces (e.g., sidewalls) of the first pillar contact structure 244 and the second pillar contact structure 246. In additional embodiments, the lower boundaries of the first pillar contact structure 244 and the second pillar contact structure 246 vertically underlie upper boundaries of the channel material 250 of the MUX device 216, such that the channel material 250 of the MUX device 216 at least partially (e.g., substantially) covers the side surfaces of the first pillar contact structure 244 and the second pillar contact structure 246. In some embodiments, for each MUX device 216, the lower boundaries of the first pillar contact structure 244 and the second pillar contact structure 246 thereof vertically overlie (e.g., in the Z-direction) an upper boundary (e.g., an upper surface) of an uppermost conductive structure 230 within vertical boundaries of the first select gate region 238 of the stack structure 228. The first pillar contact structure 244 and the second pillar contact structure 246 may each individually be formed of and include conductive material, such as one or more of the conductive materials previously disclosed herein in relation to the first pillar contact structures 144 (FIG. 3) of the microelectronic device structure 100 (FIGS. 1 through 3).

With continued reference to FIG. 6, the first contact structures 218 may vertically overlie and contact (e.g., physical contact, electrically contact) the first pillar contact structures 244 and the second pillar contact structures 246 of the MUX devices 216. For each MUX device 216, one first contact structure 218 vertically overlying and contacting the first pillar contact structure 244 of the MUX device 216 may couple the MUX device 216 to an individual first digit line 210. In addition, for each MUX device 216, one other first contact structure 218 vertically overlying and contacting the second pillar contact structure 246 of the MUX device 216 may couple the MUX device 216 to an individual second digit line 212. The first contact structures 218 may be formed of and include conductive material, such as one or more of the conductive materials previously disclosed herein in relation to the first contact structures 218 (FIG. 3) of the microelectronic device structure 100 (FIGS. 1 through 3). As shown in FIG. 6, in some embodiments, the first contact structures 218 each include a first conductive plug structure 256, and a first conductive liner structure 258 at least partially surrounding the first conductive plug structure 256.

With continued reference to FIG. 6, third contact structures 264 may be formed to electrically connect the first contact structures 218 coupled to the MUX device 216 to the first digit lines 210 and the second digit lines 212. For each MUX device 216, one third contact structure 264 vertically overlying and contacting an individual first contact structure 218 coupled to the first pillar contact structure 244 of the MUX device 216 may couple the first contact structure 218 (and, hence, the MUX device 216) to an individual first digit line 210. In addition, for each MUX device 216, one other third contact structure 264 vertically overlying and contacting another individual first contact structure 218 coupled to the second pillar contact structure 246 of the MUX device 216 may couple the another first contact structure 218 (and, hence, the MUX device 216) to an individual second digit line 212. The third contact structures 264 may be formed of and include conductive material, such as one or more of the conductive materials previously disclosed herein in relation to the third contact structures 164 (FIG. 3) of the microelectronic device structure 100 (FIGS. 1 through 3). As shown in FIG. 6, in some embodiments, the third contact structures 264 each include a second conductive plug structure 260, and a second conductive liner structure 262 at least partially surrounding the second conductive plug structure 260.

Still referring to FIG. 6, optionally, within the access line region 236 of the stack structure 228, portions of the tiers 234 of conductive structures 230 and insulative structures 232 may be replaced with one or more filled trenches 274 vertically underlying and at least partially within horizontal boundaries of the MUX devices 216. Horizontal areas of the MUX devices 216 may horizontally overlap horizontal areas of the filled trenches 274 within the stack structure 228. In some embodiments, horizontal areas of the MUX devices 216 are substantially confined within boundaries of horizontal areas of the filled trenches 274. The filled trenches 274, if any, may vertically extend to a desired vertical position (e.g., vertical elevation) within the access line region 236 of the stack structure 228. In some embodiments, the filled trenches 274 only partially (e.g., less than completely) vertically extend through the access line region 236 of the stack structure 228. The filled trenches 274, if included, may comprise trenches within the access line region 236 of the stack structure 228 that are filled with dielectric material, such as one of more of dielectric oxide material, dielectric nitride material, dielectric oxynitride material, dielectric oxycarbide material, hydrogenated dielectric oxycarbide material, and dielectric carboxynitride material. In some embodiments, the filled trenches 274 comprise trenches within the access line region 236 of the stack structure 228 that are filled with SiO$_2$. In additional embodiments, the filled trenches 274 are omitted (e.g., absent) from the microelectronic device structure 200. For example, the connection portions 272 of the MUX devices 216 may physically contact and/or be at least partially buried within one or more of the conductive structures 230 of one or more of the tiers 234 (e.g., upper tiers 234) within access line region 236 of the stack structure 228. In some embodiments, for an individual MUX device 216, the gate dielectric material 248 of the connection portion 272 of the MUX device 216 physical contacts at least the conductive structure 230 of an uppermost tier 234 within the access line region 236. The gate dielectric material 248 of the connection portion 272 may be interposed between conductive structure 230 and channel material 250 of the connection portion 272, so as to electrically isolate the conductive structure 230 from the channel material 250.

Figure 7:
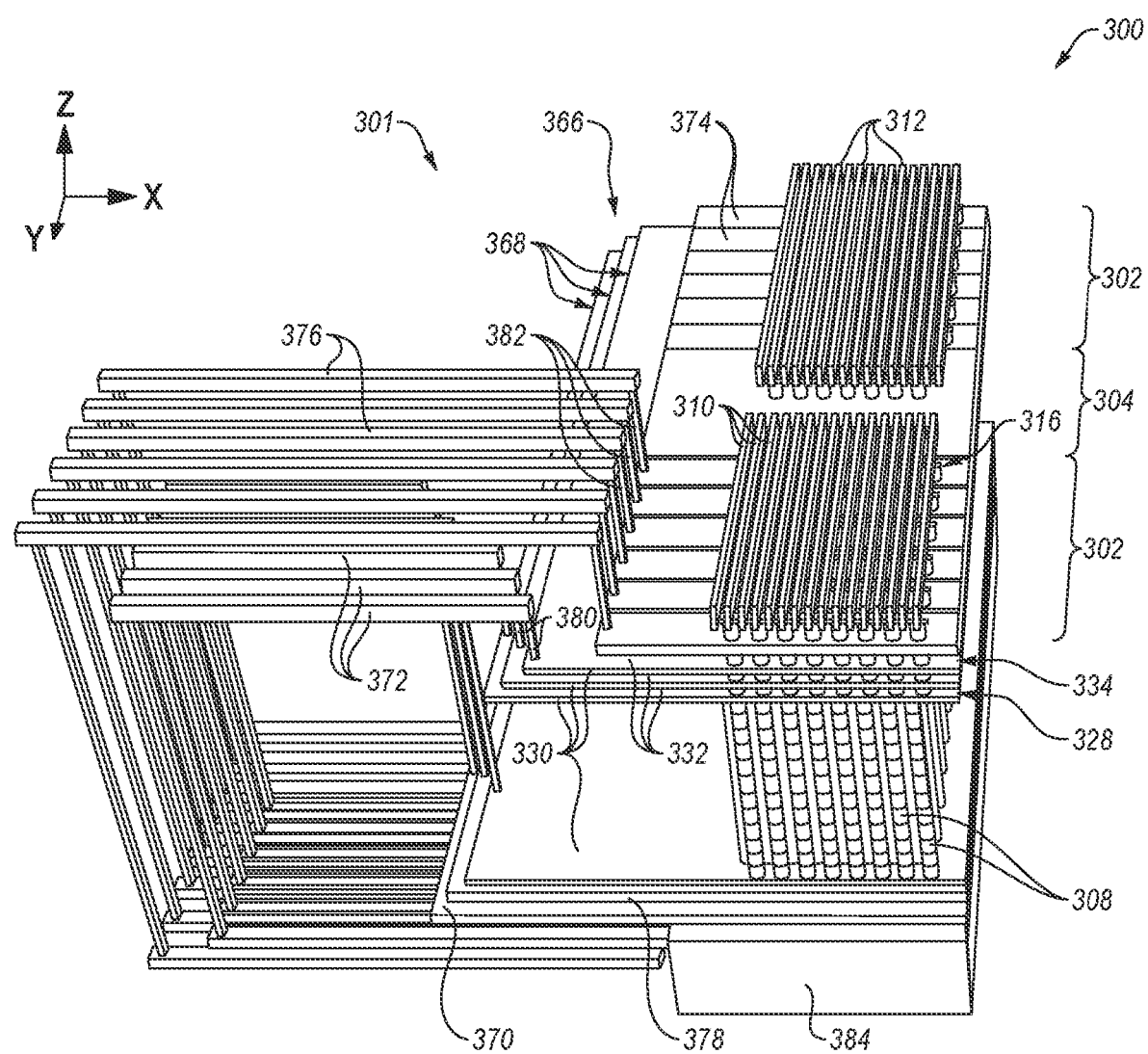
FIG. 7 is a simplified, partial cutaway perspective view of a microelectronic device, in accordance with embodiments of the disclosure.

Microelectronic device structures (e.g., the microelectronic device structure 100 (FIGS. 1 through 3), the microelectronic device structure 200 (FIGS. 4 through 6)) of the disclosure may be included in microelectronic devices of the disclosure. For example, FIG. 7 illustrates a simplified, partial cutaway perspective view of a portion of a microelectronic device 301 (e.g., a memory device, such as a 3D NAND Flash memory device) including a microelectronic device structure 300. The microelectronic device structure 300 may be substantially similar to one of the microelectronic device structure 100 (FIGS. 1 through 3) and the microelectronic device structure 200 (FIGS. 4 through 6) previously described herein. To avoid repetition, not all features (e.g., structures, materials, regions, devices) shown in FIG. 7 are described in detail herein. Rather, unless described otherwise below, in FIG. 7, a feature designated by a reference numeral that is a 100 increment of the reference numeral of a feature previously described with reference to one or more of the microelectronic device structure 100 (FIGS. 1 through 3) and the microelectronic device structure 200 (FIGS. 4 through 6) will be understood to be substantially similar to the previously described feature. In addition, for clarity and ease of understanding the drawings and associated description, some features of the microelectronic device structures previously described herein are not shown in FIG. 7. However, it will be understood that any features of the microelectronic device structure 100 previously described with reference to FIGS. 1 through 3 or the microelectronic device structure 200 previously described with reference to FIGS. 4 through 6 may be included in the microelectronic device structure 300 of the microelectronic device 301 described herein with reference to FIG. 7.

As shown in FIG. 7, the microelectronic device 301 includes MUX devices 316 coupled to first digit lines 310 and second digit lines 312. The first digit lines 310 are aligned with the second digit lines 312 in the X-direction, and are separated from the first digit lines 310 in the Y-direction orthogonal to the X-direction. The first digit lines 310 and second digit lines 312 are individually coupled to strings of memory cells 308 within memory array regions 302 of the microelectronic device structure 300, and are individually coupled one or more MUX devices 316 within the additional region 304 of the microelectronic device structure 300 interposed between the memory array regions 302 in the Y-direction. Configurations of the first digit lines 310 and the second digit lines 312 may be substantially similar to configurations of the first digit lines 110 and the second digit lines 112 of the microelectronic device structure 100 previously described with reference to FIGS. 1 through 3; or configurations of the first digit lines 310 and the second digit lines 312 may correspond to (e.g., be substantially the same as) the configurations of the first digit lines 210 and the second digit lines 212 of the microelectronic device structure 200 previously described with reference to FIGS. 4 through 6. In addition, configurations of the MUX devices 316 may correspond to (e.g., be substantially the same as) the configurations of MUX devices 116 of the microelectronic device structure 100 previously described with reference to FIGS. 1 through 3; or configurations of the MUX devices 316 may correspond to configurations of the MUX devices 216 of the microelectronic device structure 200 previously described with reference to FIGS. 4 through 6.

Still referring to FIG. 7, the microelectronic device 301 may also include one or more staircase structures 366 having steps 368 defined by edges (e.g., horizontal ends in the X-direction) of tiers 334 of a stack structure 328 of the microelectronic device 301. A configuration of the stack structure 328 (including configurations of the tiers 334 thereof) may correspond to the configuration of the stack structure 128 of the microelectronic device structure 100 previously described with reference to FIGS. 1 through 3, or may correspond to the configuration of the stack structure 228 of the microelectronic device structure 200 previously described with reference to FIGS. 4 through 6. The steps 368 of the staircase structures 366 may serve as contact regions for conductive structures 330 of at least some of the tiers 334 of the stack structure 328. In addition, the microelectronic device 301 may further include a source structure 370, access line routing structures 372, first select gates 374 (e.g., upper select gates, drain select gates (SGDs)), select line routing structures 376, second select gates 378 (e.g., lower select gates, source select gate (SGSs)), access line contact structures 380, and select line contact structures 382. The access line contact structures 380 and the select line contact structures 382 may electrically couple components to each other as shown (e.g., the select line routing structures 376 to the first select gates 374, the access line routing structures 372 to the conductive structures 330 of the tiers 334 of the stack structure 328). The first select gates 374 may comprise the conductive structures 330 of upper tiers 334 of the stack structure 328. The MUX devices 316 may be located, in part, at vertical positions (e.g., vertical elevations in the Z-direction) of the first select gates 374, and may be operatively associated with the first select gates 374. For example, transistors (e.g., corresponding to the transistors 154 (FIG. 3) of one of the MUX devices 116 (FIG. 3); or corresponding to the transistors 254 (FIG. 6) of one of the MUX devices 216 (FIG. 6)) of an individual MUX device 316 may comprise MOS-SGD transistors, and the MUX device 316 may comprise MOS-SGD MUX devices.

The microelectronic device 301 may also include a base structure 384 positioned vertically below the stack structure 328 thereof. The base structure 384 may include at least one logic region including logic devices configured to control various operations of other features (e.g., the strings of memory cells 308) of the microelectronic device 301. As a non-limiting example, the logic region of the base structure 384 may include page buffer devices, such as the page buffer devices 124 previously described with reference to FIG. 2. The page buffer devices may be coupled to the first digit lines 310 and the second digit lines 312 by way of the MUX devices 316. In addition, the logic region of the base structure 384 may further include one or more (e.g., each) of charge pumps (e.g., $V_{CCP}$ charge pumps, $V_{NEGWL}$ charge pumps, DVC2 charge pumps), delay-locked loop (DLL)

circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The logic circuitry of the logic region of the base structure 384 may be coupled to the first digit lines 310, the second digit lines 312, the source structure 370, the access line routing structures 372, and the select line routing structures 376. In some embodiments, the logic region of the base structure 384 includes string driver circuitry coupled to the conductive structures 330 of at least some of the tiers 334 of the stack structure 328 by way of the access line routing structures 372 and the access line contact structures 380. Furthermore, in some embodiments, the logic region of the base structure 384 includes CMOS (complementary metal-oxide-semiconductor) circuitry. In some such embodiments, the logic region of the base structure 384 may be characterized as having a "CMOS under Array" ("CuA") configuration, wherein the CMOS circuitry of the logic region is at least partially (e.g., substantially) positioned within horizontal areas of the memory array regions 302 of the microelectronic device 301.

Thus, in accordance with additional embodiments of the disclosure, a microelectronic device comprises a stack structure, first digit lines, second digit lines, and multiplexer devices. The stack structure includes conductive structures and insulative structures vertically alternating with the conductive structures. The stack structure comprises an access line region comprising a lower group of the conductive structures, and a select gate region overlying the access line region and comprising an upper group of the conductive structures. The first digit lines vertically overlie the stack structure and are coupled to strings of memory cells vertically extending through the stack structure. The second digit lines vertically overlie the stack structure and are coupled to additional strings of memory cells vertically extending through the stack structure. The second digit lines are horizontally offset from the first digit lines in a first direction and are substantially horizontally aligned with the first digit lines in a second direction orthogonal to the first direction. The multiplexer devices are coupled to page buffer devices, the first digit lines, and the second digit lines. The multiplexer devices comprise transistors in electrical communication with the upper group of the conductive structures within the select gate region of the stack structure.

Furthermore, in accordance with additional embodiments of the disclosure, a microelectronic device comprises a first memory array region, first digit lines, a second memory array region, second digit lines, an additional region, and page buffer devices. The first memory array region comprising first vertically extending strings of memory cells. The first digit lines are coupled to the first vertically extending strings of memory cells. The second memory array region comprises second vertically extending strings of memory cells. The second digit lines are coupled to the second vertically extending strings of memory cells. The additional region is horizontally interposed between the first memory array region and the second memory array region and comprises multiplexer devices coupled to the first digit lines and the second digit lines. Each of the multiplexer devices comprises a pillar structure vertically extending through select gate structures, and a pillar contact structure on the pillar structure and coupled to one of the first digit lines or one of the second digit lines. The page buffer devices are coupled to the multiplexer devices.

Moreover, in accordance with further embodiments of the disclosure, a memory device comprises a stack structure, a first strings of memory cells, second strings of memory cells, first digit lines, second digit lines, multiplexer devices, and a base structure. The stack structure comprises a first region comprising access line structures, and a second region vertically overlying the first region and comprising select gate structures. The first strings of memory cells vertically extend through the stack structure. The second strings of memory cells vertically extend through the stack structure. The first digit line structures are coupled to the first strings of memory cells. The second digit line structures are coupled to the second strings of memory cells. The multiplexer devices are horizontally interposed between the first strings of memory cells and the second strings of memory cells. The multiplexer devices are coupled to the select gate structures of the stack structure, the first digit line structures, and the second digit line structures. The base structure vertically underlies the stack structure and comprises a logic region including page buffer devices coupled to the multiplexer devices.

Figure 8:
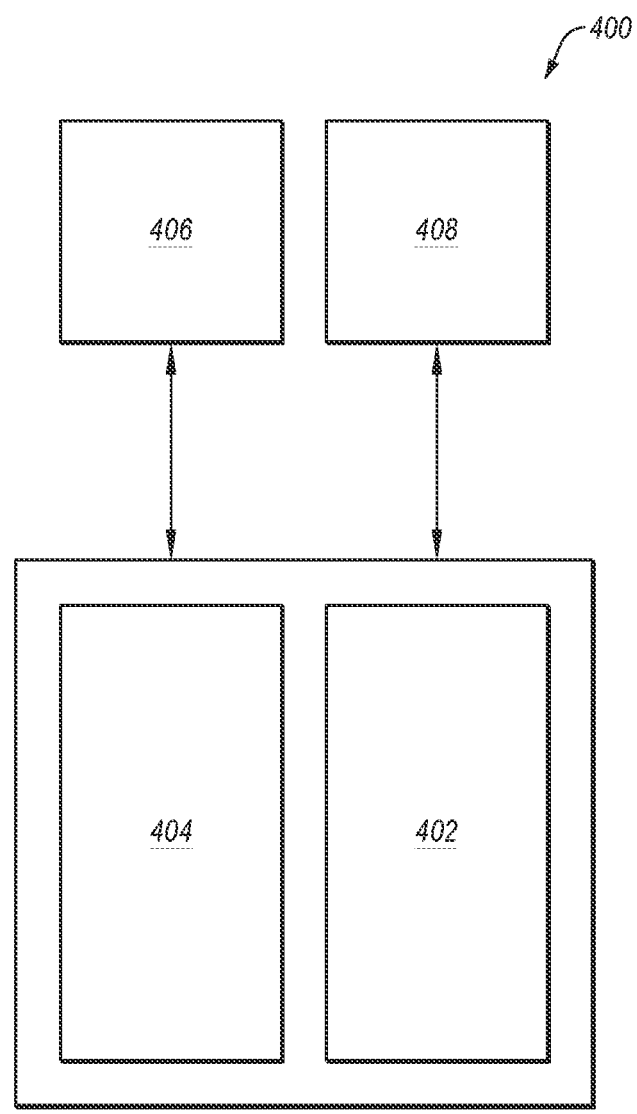
FIG. 8 is a schematic block diagram of an electronic system, in accordance with an embodiment of the disclosure.

Microelectronic devices structures (e.g., the microelectronic device structure 100, the microelectronic device structure 200) and microelectronic devices (e.g., the microelectronic device 301) in accordance with embodiments of the disclosure may be used in embodiments of electronic systems of the disclosure. For example, FIG. 8 is a schematic block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, one or more of a microelectronic device structure (e.g., the microelectronic device structure 100, the microelectronic device structure 200) and a microelectronic device (e.g., the microelectronic device 301) previously described herein. The electronic system 400 may further include at least one electronic signal processor device 404 (often referred to as a "microprocessor"). The electronic signal processor device 404 may, optionally, include one or more of a microelectronic device structure (e.g., the microelectronic device structure 100, the microelectronic device structure 200) and a microelectronic device (e.g., the microelectronic device 301) previously described herein. While the memory device 402 and the electronic signal processor device 404 are depicted as two (2) separate devices in FIG. 8, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure (e.g., the microelectronic device structure 100, the microelectronic device structure 200) and a microelectronic device (e.g., the microelectronic device 301) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably connected to the input device and the output device, and a memory device operably connected to the processor device. The memory device comprises a stack structure, strings of memory cells, first digit lines, second digit lines, multiplexor devices, and a base structure. The stack structure includes a vertically alternating sequence of conductive structures and insulative structures arranged in tiers. The stack structure comprises a first region comprising a lower group of the conductive structures configured as access line structures, and a second region overlying the first region and comprising an upper group of the conductive structures configured as select gate structures. The strings of memory cells vertically extend through the stack structure. The first digit lines vertically overlie the stack structure and are coupled to some of the strings of memory cells. The second digit lines vertically overlie the stack structure and are coupled to some other of the strings of memory cells. The multiplexer devices are coupled to the first digit lines, the second digit lines, and the upper group of the conductive structures within the second region of the stack structure. The base structure vertically underlies the stack structure and comprises logic circuitry including page buffer devices coupled to the multiplexer devices.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
   a stack structure including conductive structures and insulative structures vertically alternating with the conductive structures, the stack structure comprising:
      an access line region comprising a lower group of the conductive structures; and
      a select gate region overlying the access line region and comprising an upper group of the conductive structures;
   first digit lines vertically overlying the stack structure and coupled to strings of memory cells vertically extending through the stack structure;
   second digit lines vertically overlying the stack structure and coupled to additional strings of memory cells vertically extending through the stack structure, the second digit lines horizontally offset from the first digit lines in a first direction and substantially horizontally aligned with the first digit lines in a second direction orthogonal to the first direction; and
   multiplexer devices coupled to page buffer devices, the first digit lines, and the second digit lines, the multiplexer devices comprising transistors in electrical communication with the upper group of the conductive structures within the select gate region of the stack structure.

2. The microelectronic device of claim 1, wherein one of the multiplexer devices comprises:
   a pillar structure vertically extending through the upper group of the conductive structures within the select gate region of the stack structure; and
   a first pillar contact structure vertically over and in electrical communication with the pillar structure, the first pillar contact structure coupled to one of the first digit lines.

3. The microelectronic device of claim 2, wherein the one of the multiplexer devices further comprises a second pillar contact structure vertically under and in electrical communication with the pillar structure, the second pillar contact structure coupled to one or more conductive routing structures underlying the stack structure and in electrical communication with one or more of the page buffer devices.

4. The microelectronic device of claim 3, wherein one other of the multiplexer devices comprises:
   an additional pillar structure vertically extending through the upper group of the conductive structures within the select gate region of the stack structure;
   an additional first pillar contact structure vertically over and in electrical communication with the additional pillar structure, the additional first pillar contact structure coupled to one of the second digit lines horizontally aligned with the one of the first digit lines in the second direction; and
   an additional second pillar contact structure vertically under and in electrical communication with the additional pillar structure, the additional second pillar contact structure coupled to the one or more conductive routing structures.

5. The microelectronic device of claim 4, further comprising:
   a conductive contact structure vertically extending through the lower group of the conductive structures within the access line region of the stack structure, the conductive contact structure coupling the second pillar contact structure of the one of the multiplexer devices to the one or more conductive routing structures; and
   an additional conductive contact structure vertically extending through the lower group of the conductive structures within the access line region of the stack structure, the additional conductive contact structure coupling the additional second pillar contact structure of the other of the multiplexer devices to the one or more conductive routing structures.

6. The microelectronic device of claim 4, wherein the pillar structure of the one of the multiplexer devices and the additional pillar structure of the one other of the multiplexer devices each individually comprise:
 a channel material;
 a gate dielectric material horizontally interposed between the channel material and the upper group of the conductive structures within the select gate region of the stack structure; and
 a dielectric fill material horizontally surrounded by the channel material.

7. The microelectronic device of claim 2, wherein the one of the multiplexer devices further comprises:
 an additional pillar structure vertically extending through the upper group of the conductive structures within the select gate region of the stack structure;
 a connection portion horizontally extending from and between the pillar structure and the additional pillar structure, the connection portion vertically underlying the select gate region of the stack structure; and
 a second pillar contact structure vertically over and in electrical communication with the additional pillar structure, the second pillar contact structure coupled to one of the second digit lines horizontally aligned with the one of the first digit lines in the second direction.

8. The microelectronic device of claim 7, wherein the pillar structure, the additional pillar structure, and the connection portion of the one of the multiplexer devices each comprise:
 a dielectric fill material;
 a channel material at least partially outwardly surrounding the dielectric fill material; and
 a gate dielectric material at least partially outwardly surrounding the channel material.

9. The microelectronic device of claim 7, wherein the connection portion is at least partially positioned within an isolation region vertically interposed between the access line region and the select gate region of the stack structure.

10. The microelectronic device of claim 7, further comprising a conductive contact structure horizontally offset from the one of the multiplexer devices and vertically extending from the one of the first digit lines or the one of the second digit lines to one or more conductive routing structures underlying the stack structure and in electrical communication with one or more of the page buffer devices.

11. A microelectronic device, comprising:
 a first memory array region comprising first vertically extending strings of memory cells;
 first digit lines coupled to the first vertically extending strings of memory cells;
 a second memory array region comprising second vertically extending strings of memory cells;
 second digit lines coupled to the second vertically extending strings of memory cells;
 an additional region horizontally interposed between the first memory array region and the second memory array region and comprising multiplexer devices coupled to the first digit lines and the second digit lines, each of the multiplexer devices comprising:
  a pillar structure vertically extending through select gate structures; and
  a pillar contact structure on the pillar structure and coupled to one of the first digit lines or one of the second digit lines; and
 page buffer devices coupled to the multiplexer devices.

12. The microelectronic device of claim 11, wherein, for each of the multiplexer devices, intersections between the pillar structure thereof and the select gate structures form transistors thereof.

13. The microelectronic device of claim 11, wherein pairs of the multiplexer devices are coupled to one another within the additional region through conductive contact structures and conductive routing structures vertically underlying the multiplexer devices, for each of the pairs of the multiplexer devices:
 one of the multiplexer devices thereof coupled to the one of the first digit lines; and
 an additional one of the multiplexer devices thereof coupled to the one of the second digit lines.

14. The microelectronic device of claim 11, wherein each of the multiplexer devices further comprises:
 an additional pillar structure vertically extending through select gate structures;
 a routing portion integral with and continuously extending from and between the pillar structure and the additional pillar structure; and
 an additional pillar contact structure on the additional pillar structure, the additional pillar contact structure coupled to the one of the second digit lines if the pillar contact structure is coupled to the one of the first digit lines, or the additional pillar contact structure coupled to the one of the first digit lines if the pillar contact structure is coupled to the one of the second digit lines.

15. The microelectronic device of claim 11, further comprising transistors interposed between and in electrical communication with the multiplexer devices and the page buffer devices.

16. The microelectronic device of claim 11, wherein:
 the first digit lines horizontally extend in parallel in a first direction through the first memory array region and partially into the additional region; and
 the second digit lines horizontally extend in parallel in the first direction through the second memory array region and partially into the additional region, the second digit lines separated from the first digit lines in the first direction and substantially aligned with the first digit lines in a second direction perpendicular to the first direction.

17. A memory device, comprising:
 a stack structure comprising:
  a first region comprising access line structures; and
  a second region vertically overlying the first region and comprising select gate structures;
 first strings of memory cells vertically extending through the stack structure;
 second strings of memory cells vertically extending through the stack structure;
 first digit line structures coupled to the first strings of memory cells;
 second digit line structures coupled to the second strings of memory cells;
 multiplexer devices horizontally interposed between the first strings of memory cells and the second strings of memory cells, the multiplexer devices coupled to the select gate structures of the stack structure, the first digit line structures, and the second digit line structures; and
 a base structure vertically underlying the stack structure and comprising a logic region including page buffer devices coupled to the multiplexer devices.

18. The memory device of claim 17, wherein transistors of the multiplexer devices are coupled to the select gate structures of the stack structure and are positioned within vertical boundaries of the second region of the stack structure.

19. The memory device of claim 18, wherein:
the select gate structures comprise drain side select gate (SGD) structures; and
the transistors of the multiplexer devices comprise metal-oxide-semiconductor (MOS) transistors.

20. The memory device of claim 17, wherein the stack structure further comprises a third region vertically underlying the first region and comprising additional select gate structures.

21. The memory device of claim 17, wherein the logic region of the base structure further comprises string driver circuitry coupled to some of the access line structures of the stack structure.

22. The memory device of claim 17, wherein logic circuitry within the logic region of the base structure comprises complementary metal oxide semiconductor (CMOS) circuitry.

23. An electronic system, comprising:
an input device;
an output device;
a processor device operably connected to the input device and the output device; and
a memory device operably connected to the processor device and comprising:
  a stack structure including a vertically alternating sequence of conductive structures and insulative structures arranged in tiers, the stack structure comprises:
    a first region comprising a lower group of the conductive structures configured as access line structures; and
    a second region overlying the first region and comprising an upper group of the conductive structures configured as select gate structures;
  strings of memory cells vertically extending through the stack structure;
  first digit lines vertically overlying the stack structure and coupled to some of the strings of memory cells;
  second digit lines vertically overlying the stack structure and coupled to some other of the strings of memory cells;
  multiplexer devices coupled to the first digit lines, the second digit lines, and the upper group of the conductive structures within the second region of the stack structure; and
  a base structure vertically underlying the stack structure and comprising logic circuitry including page buffer devices coupled to the multiplexer devices.

24. The electronic system of claim 23, wherein:
the first digit lines extend in parallel in a first horizontal direction; and
the second digit lines extend in parallel in the first horizontal direction and are substantially aligned with the first digit lines in a second horizontal direction orthogonal to the first horizontal direction.

25. The electronic system of claim 23, wherein the memory device comprises a 3D NAND Flash memory device.

* * * * *

UNITED STATES PATENT AND TRADEMARK OFFICE
CERTIFICATE OF CORRECTION

PATENT NO. : 12,101,932 B2
APPLICATION NO. : 17/450729
DATED : September 24, 2024
INVENTOR(S) : Erwin E. Yu et al.

Page 1 of 1

It is certified that error appears in the above-identified patent and that said Letters Patent is hereby corrected as shown below:

In the Specification

| | | |
|---|---|---|
| Column 1, | Line 25, | change "integration density of features" to --integration or density of features-- |
| Column 13, | Line 37, | change "oxide ($Al_xSn_yIn_zZn_zO$), silicon" to --oxide ($Al_xSn_yIn_zZn_aO$), silicon-- |
| Column 27, | Line 33, | change "structure 242A thereof and a lower" to --structure 242A thereof, and a lower-- |

Signed and Sealed this
Seventh Day of January, 2025

Derrick Brent
*Acting Director of the United States Patent and Trademark Office*